(12) United States Patent
Prater

(10) Patent No.: US 6,842,051 B1
(45) Date of Patent: Jan. 11, 2005

(54) VOLTAGE DETECTOR CIRCUIT WITH APPLICATION TO VARIABLE VOLTAGE FILTER AND VARIABLE OUTPUT BUFFER

(75) Inventor: James Scott Prater, Fort Collins, CO (US)

(73) Assignee: NaTIONAL Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/391,117

(22) Filed: Mar. 17, 2003

(51) Int. Cl.⁷ .................................................. H03K 5/22
(52) U.S. Cl. ............................. 327/78; 327/80; 327/81
(58) Field of Search ............................. 327/78–81, 89

(56) References Cited

U.S. PATENT DOCUMENTS

| | | | |
|---|---|---|---|
| 6,297,683 B1 * | 10/2001 | Drapkin et al. | 327/333 |
| 6,577,166 B2 * | 6/2003 | Lim | 327/77 |
| 6,628,152 B1 * | 9/2003 | Kern et al. | 327/143 |
| 6,636,089 B2 * | 10/2003 | Majcherczak et al. | 327/143 |

* cited by examiner

Primary Examiner—Kenneth B. Wells

(57) ABSTRACT

Within one embodiment, a voltage detector circuit detects whether a voltage supply (e.g., $V_{DD}$) is in a high or low range and generates a logic output. Using this logic output, a variable RC (resistor capacitor) $V_{DD}$ filter may be implemented such that at high $V_{DD}$ the amount of resistance is increased, thereby increasing the decoupling on the $V_{DD}$ line and reducing the size of current spikes on $V_{DD}$. This is particularly useful in circuits that function over a wide range of $V_{DD}$ supply. The voltage detector circuit can also be used in other embodiments as well. For example, the voltage detector circuit may be used to change the drive strength (e.g., effective W/L) of an output driver such that more drive is provided at low $V_{DD}$ and less at high $V_{DD}$ thereby having the effect of reducing rise/fall time variation and reducing the size of current spikes at high $V_{DD}$.

20 Claims, 13 Drawing Sheets

US 6,842,051 B1

VOLTAGE DETECTOR CIRCUIT WITH APPLICATION TO VARIABLE VOLTAGE FILTER AND VARIABLE OUTPUT BUFFER

BACKGROUND

Conventionally, there are some integrated circuit (IC) chips that have to operate over a wide ranging voltage supply ($V_{DD}$). For example, the voltage supply may range from a lower value of 2.7 volts (V) to a higher value of 5.25V. As such, the wide ranging voltage supply can present some different challenges for implementing different circuitry within IC chips. Additionally, within this category of IC chips, there are some IC chips that also include both digital logic circuitry together with analog circuitry within the same chip. It is noted that there are disadvantages associated with these type of IC chips.

For example, a grouping of digital logic circuitry on an IC chip may create current spikes on a power supply line that is also utilized or shared by some analog circuitry. As such, it is appreciated that these resulting current spikes can temporarily or consistently "contaminate" the proper operation of one or more elements of the analog circuitry.

One conventional solution for "decoupling" the voltage supplied to the digital logic from the voltage supplied to the analog circuitry is to include an RC (resistor capacitor) filter circuit as part of the IC chip. The RC filter circuit is typically located between the voltage supply and the digital logic circuitry in order to reduce the occurrence of current spikes on the voltage supply line. Additionally, the analog circuitry can receive its voltage supply directly from a voltage supply pin of the IC chip. However, there are disadvantages associated with this conventional solution.

For example, since the voltage supply to the digital logic covers a wide range of voltages, the RC filter circuit may not operate very well over that entire voltage range. Typically, the resistance of the RC filter is determined such that it does not provide too much attenuation to the low supply voltage levels while providing enough resistance to reduce the size of the current spikes on the voltage supply line at the high supply voltage levels. Therefore, to enable the RC filter to operate over the entire voltage range of the supply voltage, the RC filter is commonly implemented with a resistance value that sacrifices an amount of operational performance at some voltage supply levels within the voltage range.

The present invention may address one or more of the above issues.

SUMMARY OF THE INVENTION

Within one embodiment, a voltage detector circuit detects whether a voltage supply (e.g., $V_{DD}$) is in a high or low range and generates a logic output. Using this logic output, a variable RC (resistor capacitor) $V_{DD}$ filter may be implemented such that at high $V_{DD}$ the amount of resistance is increased, thereby increasing the decoupling on the $V_{DD}$ line and reducing the size of current spikes on $V_{DD}$. This is particularly useful in circuits that function over a wide range of $V_{DD}$ supply. The voltage detector circuit can also be used in other embodiments as well. For example, the voltage detector circuit may be used to change the drive strength (e.g., effective W/L) of an output driver such that more drive is provided at low $V_{DD}$ and less at high $V_{DD}$ thereby having the effect of reducing rise/fall time variation and reducing the size of current spikes at high $V_{DD}$.

In another embodiment, the present invention provides a method for detecting when a voltage supply is within a first voltage range or a second voltage range. The method includes establishing a reference voltage. The reference voltage and a switching element are utilized to detect when the voltage supply is in the first voltage range or the second voltage range. Provided the voltage supply is in the first voltage range, an input of a buffer element is coupled to a higher voltage. Provided the voltage supply is in the second voltage range, the input of the buffer element is coupled to a lower voltage. The buffer element is utilized to generate an output signal.

In yet another embodiment, the present invention provides a voltage detector circuit. The voltage detector circuit includes a pull-up element that is coupled to a voltage supply and a reference voltage. The voltage detector circuit also includes a pull-down element coupled to the reference voltage and the pull-up element. Additionally, the voltage detector circuit includes a switching element coupled to the pull-up element and the pull-down element. It is noted that the switching element can be for generating an output signal corresponding to the value of the voltage supply.

In still another embodiment, the present invention provides a voltage detector circuit. The voltage detector circuit includes a diode stack element coupled to a voltage supply. The voltage detector circuit also includes a current mirror element coupled to the diode stack. Furthermore, the voltage detector circuit includes a buffer element coupled to the current mirror element. The buffer element can be for generating an output signal corresponding to the value of the voltage supply.

While particular embodiments of the present invention have been specifically described within this summary, it is noted that the invention is not limited to these embodiments. The invention is intended to cover alternatives, modifications and equivalents which may be included within the scope of the invention as defined by the claims.

DESCRIPTION OF PREFERRED EMBODIMENTS

Reference will now be made in detail to embodiments of the invention, examples of which are illustrated in the accompanying drawings. While the invention will be described in conjunction with embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present invention, numerous specific details are set forth in order to provide a thorough understanding of the present invention. However, it will be evident to one of ordinary skill in the art that the present invention may be practiced without these specific details. In other instances, well known methods, procedures, components, and circuits have not been described in detail so as not to unnecessarily obscure aspects of the present invention.

Within embodiments of the present invention, a voltage detector circuit detects whether a voltage supply (e.g., $V_{DD}$) is in a high or low range and generates a logic output. Using this logic output, a variable RC $V_{DD}$ filter may be implemented such that at high $V_{DD}$ the amount of resistance of the filter is increased, thereby increasing the decoupling on the $V_{DD}$ line and reducing the size of current spikes on $V_{DD}$. This is particularly useful in circuits that function over a wide range of $V_{DD}$ supply (e.g., 2.7–5.25 volts). It is noted that the voltage detector circuit can also be utilized in other embodiments as well. For example, the voltage detector circuit may be utilized in combination with an output driver. Specifically, the voltage detector may be used to change the drive strength (e.g., effective W/L) of the output driver such that more drive is provided at low $V_{DD}$ and less at high $V_{DD}$ which has the effect of reducing rise/fall time variation and reducing the size of current spikes at high $V_{DD}$. Additionally, the voltage detector circuit may be utilized in combination with a start up circuit. For example, the voltage detector may be used to change the pull-down strength of the start up circuit thereby tailoring it to be fast enough when $V_{DD}$ is either in a high or low range without causing excessive current spikes in mirror currents.

Figure 1:
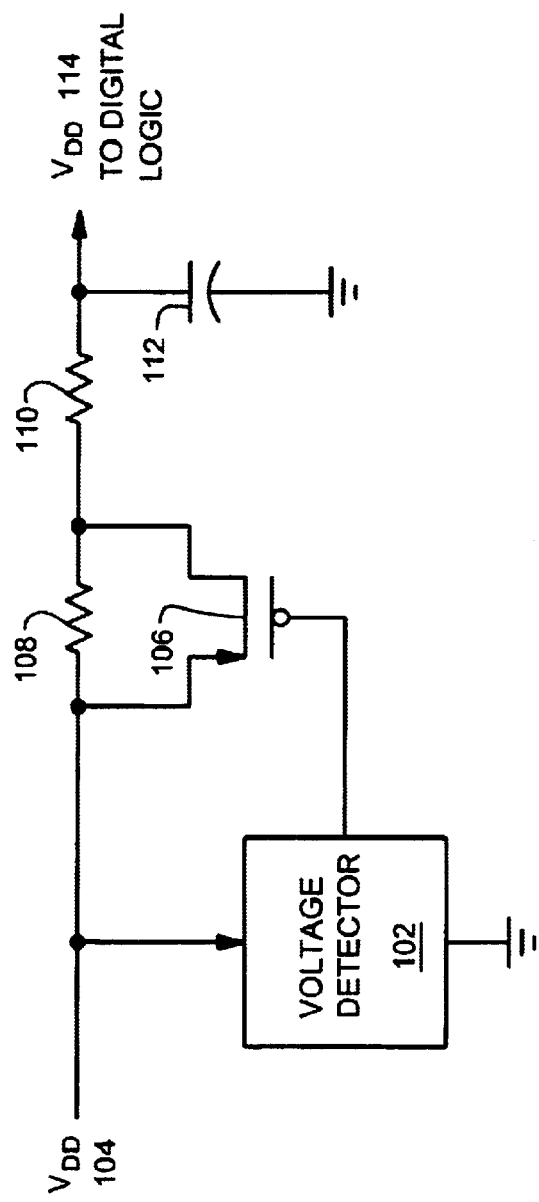
FIG. 1 is a diagram of an exemplary variable $V_{DD}$ filter circuit in accordance with an embodiment of the present invention.

FIG. 1 is a diagram of an exemplary variable $V_{DD}$ filter circuit 100 in accordance with an embodiment of the present invention. Within variable $V_{DD}$ filter circuit 100, it is understood that a supply voltage ($V_{DD}$) 104 can be within a high voltage range (e.g., 4.75–5.25 volts) or within a low voltage range (e.g., 2.7–3.6 volts). As such, when a voltage detector circuit 102 detects $V_{DD}$ 104 in the high voltage range, it causes the resistance of the variable $V_{DD}$ filter circuit 100 to be increased resulting in increased decoupling for $V_{DD}$ 114 and also reduces the size of the current spikes of $V_{DD}$ 114. It is understood that $V_{DD}$ 114 may be provided for reception by digital logic. When voltage detector 102 detects $V_{DD}$ 104 in the low voltage range, it causes the resistance of variable filter circuit 100 to be decreased. In this manner, voltage detector 102 enables the variable $V_{DD}$ filter circuit 100 to operate better in both the high voltage range and low voltage range of $V_{DD}$ 104.

Specifically, when $V_{DD}$ 104 is within the high voltage range, voltage detector 102 is coupled to receive and recognize that condition. As such, within the present embodiment, voltage detector 102 outputs a logical "1" (high) signal which is received by a transistor 106 causing it to turn off which increases the resistance of filter circuit 100. It is noted that transistor 106 may be referred to as a switching element. With transistor 106 turned off, the resistance of variable $V_{DD}$ filter circuit 100 is substantially equal to the resistance of a resistor 108 in combination with the resistance of a resistor 110. In this manner, resistors 108 and 110 together with a capacitor 112 provide a more aggressive filter for $V_{DD}$ 104 when in its high voltage range.

Conversely, when $V_{DD}$ 104 is within the low voltage range, voltage detector 102 of the present embodiment recognizes that condition and outputs a logical "0" (low) signal that causes transistor 106 to turn on and become conductive thereby reducing the resistance of variable $V_{DD}$ filter circuit 100 by providing a short around resistor 108. As such, the resistance of variable $V_{DD}$ filter circuit 100 is substantially equal to the resistance of resistor 110. In this fashion, resistor 110 together with capacitor 112 provide a less aggressive filter for $V_{DD}$ 104 when in its low voltage range.

Within FIG. 1, $V_{DD}$ 104 is coupled to the voltage detector 102, a first terminal of resistor 108 and the source of transistor 106. The voltage detector 102 is coupled to ground, e.g., logical "0" (low), and its output is coupled to the gate of transistor 106. Additionally, the source of transistor 106 is coupled to the first terminal of resistor 108 while its drain is coupled to a second terminal of resistor 108. Furthermore, the drain of transistor 106 is coupled to a first terminal of resistor 110 while a second terminal of resistor 110 is coupled to a first terminal of capacitor 112. A second terminal of capacitor 112 is coupled to ground (e.g., logic zero). It is understood that $V_{DD}$ 114 may be output from resistor 110 and capacitor 112 for reception by digital logic.

Within the present embodiment, transistor 106 is implemented as a P-channel MOSFET (metal-oxide semiconductor field-effect transistor) also know as a PMOS. However, the present embodiment is not limited to such implementation. It is noted that transistor 106 can be implemented in different ways in accordance with the present embodiment. For example, transistor 106 may be implemented as, but is not limited to, a N-channel MOSFET (NMOS).

It is appreciated that variable $V_{DD}$ filter circuit 100 is well suited to be implemented in a wide variety of ways. For example, transistor 106 may be implemented as a NMOS within variable $V_{DD}$ filter circuit 100. As such, the output signals produced by voltage detector 102 would be inverted. Within another embodiment, capacitor 112 may be coupled in parallel with one or more capacitors. Alternatively, resistor 108 and/or resistor 110 may each be coupled in parallel with one or more resistors. It is noted that variable $V_{DD}$ filter circuit 100 is not limited in any way to these mentioned embodiments. Additionally, it is understood that $V_{DD}$ 104 may cover a wide range of voltage values. As such, the low voltage range and the high voltage range of $V_{DD}$ 104 may each include a wide range of voltage values. Therefore, $V_{DD}$ 104 is not limited in any way to the exemplary voltage ranges recited herein.

Figure 2:
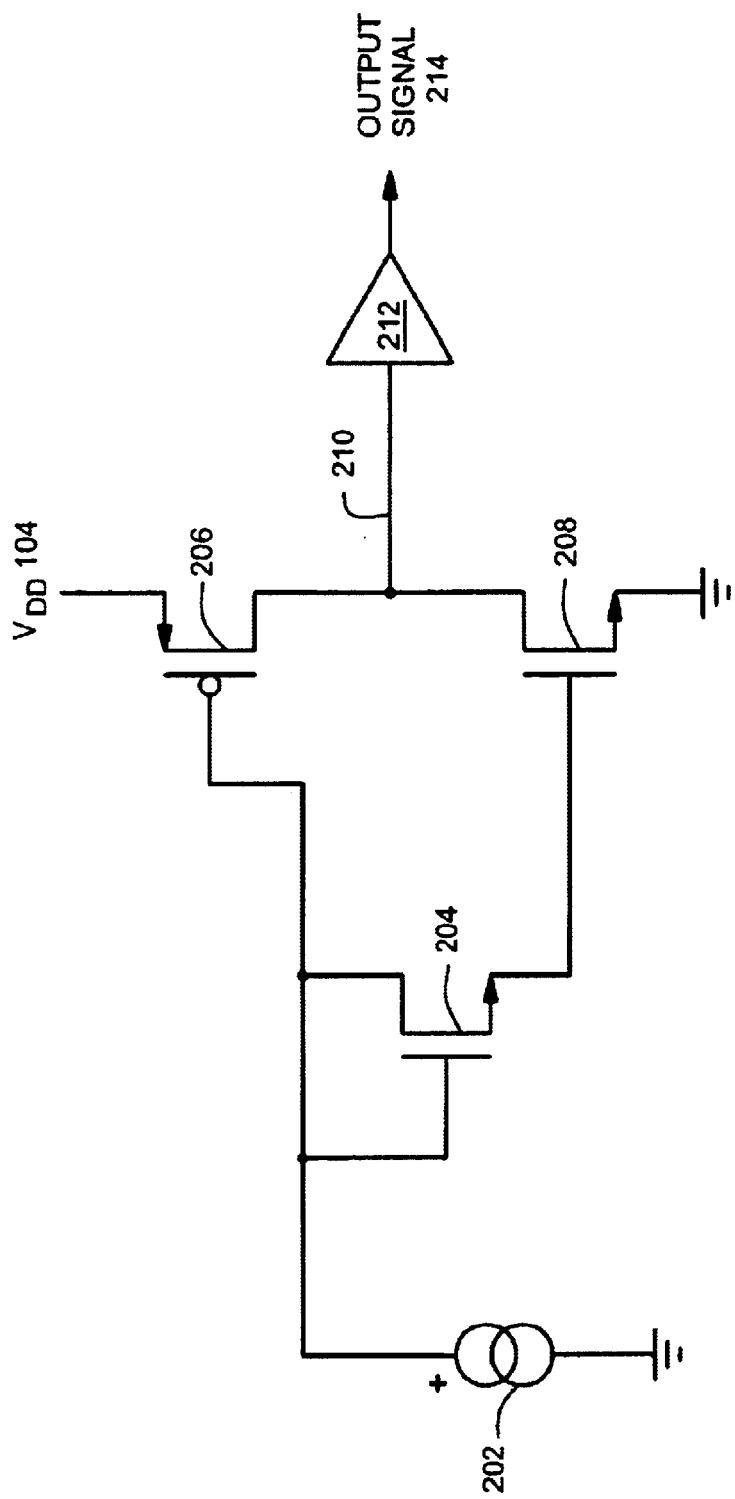
FIG. 2 is a schematic diagram of an exemplary voltage detector circuit in accordance with an embodiment of the present invention.

FIG. 2 is a schematic diagram of an exemplary voltage detector circuit 200 in accordance with an embodiment of the present invention. It is noted that voltage detector circuit 200 may be utilized as an implementation for voltage detector circuit 102 of FIG. 1. The voltage detector circuit 200 of FIG. 2 is designed to detect when $V_{DD}$ 104 is in a high voltage range (e.g., 4.75–5.25 volts) or in a low voltage range (e.g., 2.7–3.6 volts). Generally, when $V_{DD}$ 104 is within the high voltage range, a transistor 206 is turned on hard causing a node 210 to be pulled up to the high voltage level of $V_{DD}$ 104. As such, a buffer circuit 212 produces an output signal 214 which is a logical "1" (high). However, when V., 104 is within a low voltage range, transistor 206 may be substantially turned off while transistor 208 is turned on hard thereby pulling node 210 down to ground. As such, buffer circuit 212 produces output signal 214 which is a logical "0" (low).

Specifically, voltage detector circuit 200 includes a bandgap voltage 202 which is a substantially constant voltage over temperature and over process. It is understood that bandgap voltage 202 may be implemented as a wide variety of voltage values. For example, when $V_{DD}$ 104 is at a low level, the value of bandgap 202 should enable transistor 206 to be substantially turned off. As such, the difference between the lower value of $V_{DD}$ 104 and the value of bandgap 202 may be less than the threshold voltage ($V_T$) of transistor 206. In other words, the value of bandgap 202 may be implemented such that it is less than the threshold voltage of transistor 206 from the lower value of $V_{DD}$ 104. For example, if the lower value of $V_{DD}$ 104 is substantially equal to 2.7 volts (V) and the threshold voltage of transistor 206 is substantially 0.5V, the bandgap voltage 202 may be substantially equal to 2.5V.

Within FIG. 2, if bandgap voltage 202 is substantially equal to 2.5 V (for example), when $V_{DD}$ 104 is within the high voltage range (e.g., 4.75–5.25 volts), transistor 206 is turned on hard. That is, the gate of transistor 206 is substantially equal to 2.5 V while its source is coupled to $V_{DD}$ 104 within the high voltage range. It is understood that transistor 206 begins turning on and conducting current to node 210 when the voltage value of $V_{DD}$ 104 is greater than the combination of the bandgap voltage 202 plus the threshold voltage of transistor 206. Given $V_{DD}$ 104 is approximately equal to at least 4.75V within the present example, the bandgap voltage 202 is substantially equal to 2.5 V and the threshold voltage of transistor 206 may be 0.5V, transistor 206 turns on hard and conducts current to node 210.

Additionally, when $V_{DD}$ 104 is within the high voltage range, transistor 208 turns on softly since its gate is at a higher voltage level (e.g., 2.0V) than the combination of its source voltage plus its threshold voltage (e.g., 0.5V). As such, transistor 206 pulls node 210 up to $V_{DD}$ 104 while transistor 208 struggles to pull node 210 down to ground. It is noted that transistor 206 succeeds in pulling node 210 up to $V_{DD}$ 104 since transistor 204 reduces the drive of transistor 208 causing it to turn on softly. In addition to transistor 204 lowering the drive on transistor 208, transistors 206 and 208 can be sized so that transistor 206 wins in the high $V_{DD}$ 104 case and transistor 208 wins in the low $V_{DD}$ 104 case. Transistor 206 may be referred to as a pull-up element while transistor 208 may be referred to as a pull-down element. With node 210 pulled up to $V_{DD}$ 104, buffer 212 receives that voltage value and produces output signal 214 as a logic "1." (high) since buffer 212 is a non-inverting buffer. Buffer 212 may alternatively be implemented as an inverting buffer. It is appreciated that buffer 212 may also be implemented with hysteresis to provide more stable switching.

It is understood that the voltage at the gate of transistor 208 is substantially equal to the value of bandgap voltage 202 minus the threshold voltage of transistor 204 (that may be referred to as a level shifter element). For example, if the threshold voltage of transistor 204 is substantially equal to 0.5V and bandgap 202 is substantially equal to 2.5V, the voltage at the gate of transistor 208 would be substantially equal to 2.0V. Additionally, the source of transistor 208 is at ground, e.g., logical "0" (low). It is noted that transistor 204 is diode connected thereby reducing the amount of voltage at the gate of transistor 208 causing it to have less drive and turn on softly. In this manner, not as much current is wasted when transistors 206 and 208 are both turned on.

Within FIG. 2, when $V_{DD}$ 104 is within the low voltage range (e.g., 2.7–3.6 volts) and bandgap voltage 202 is substantially equal to 2.5 V (for example), transistor 206 may be turned on softly or turned off while transistor 208 is turned on hard thereby pulling node 210 to ground or a logical "0" (low) value. Specifically, the source of transistor 208 within the present example is at ground while its gate is substantially equal to 2.0V if the threshold voltage of transistor 204 is equal to 0.5V. Since the voltage level at the gate of transistor 208 is greater than the combination of its source voltage plus its threshold voltage (e.g., 0.5V), transistor 208 turns on hard causing node 210 to be pulled down to ground.

Additionally, when $V_{DD}$ 104 is within the low voltage range, transistor 206 is substantially turned off if its source voltage is less than the combination of its gate voltage plus its threshold voltage. For example, if the source voltage of transistor 206 is equal to 2.7V, its gate voltage is equal to 2.5V and its threshold voltage equal to 0.5V, transistor 206 would be substantially turned off. As such, transistor 208 pulls node 210 down to ground. With node 210 pulled down to ground or a logic "0" (low) voltage level, buffer 212 receives that voltage value and produces output signal 214 as a logic "0" (low) since buffer 212 is a non-inverting buffer.

Within voltage detector circuit 200 of FIG. 2, the positive polarity terminal of bandgap voltage reference 202 is coupled to transistor 206 and transistor 204 while the negative polarity terminal of bandgap 202 is coupled to ground or a logical "0" (low). Specifically, the positive polarity terminal of bandgap 202 is coupled to the gate and drain of transistor 204 and the gate of transistor 206. Additionally, the source of transistor 206 is coupled to $V_{DD}$ 104 while its drain is coupled to node 210. The gate of transistor 208 is coupled to the source of transistor 204. Additionally, the drain of transistor 208 is coupled to node 210 while its source is coupled to ground or a logical "0" (low). The input of buffer 212 is coupled to node 210 while its output is coupled to produce output signal 214.

Within the present embodiment, transistor 206 is implemented as a PMOS while transistors 204 and 208 are each implemented as a NMOS. However, the present embodiment is not limited to such implementation. It is noted that transistors 204, 206 and 208 can be implemented in different ways in accordance with the present embodiment. For example, transistors 204 and 208 may each be implemented as, but is not limited to, a NMOS or PMOS device. However, for this change to be implemented, it may involve implementing circuit 200 in a different manner. Transistors 204, 206 and 208 can each be referred to as a switching element. It is understood that buffer circuit 212 may be implemented in diverse ways. For example, buffer circuit 212 may be implemented as, but is not limited to, a Schmitt trigger circuit or two inverter circuits coupled in series. Additionally, buffer circuit 212 can be referred to as a switching element or a buffer element. It is noted that circuit 200 may be implemented in a wide variety of ways.

Figure 3:
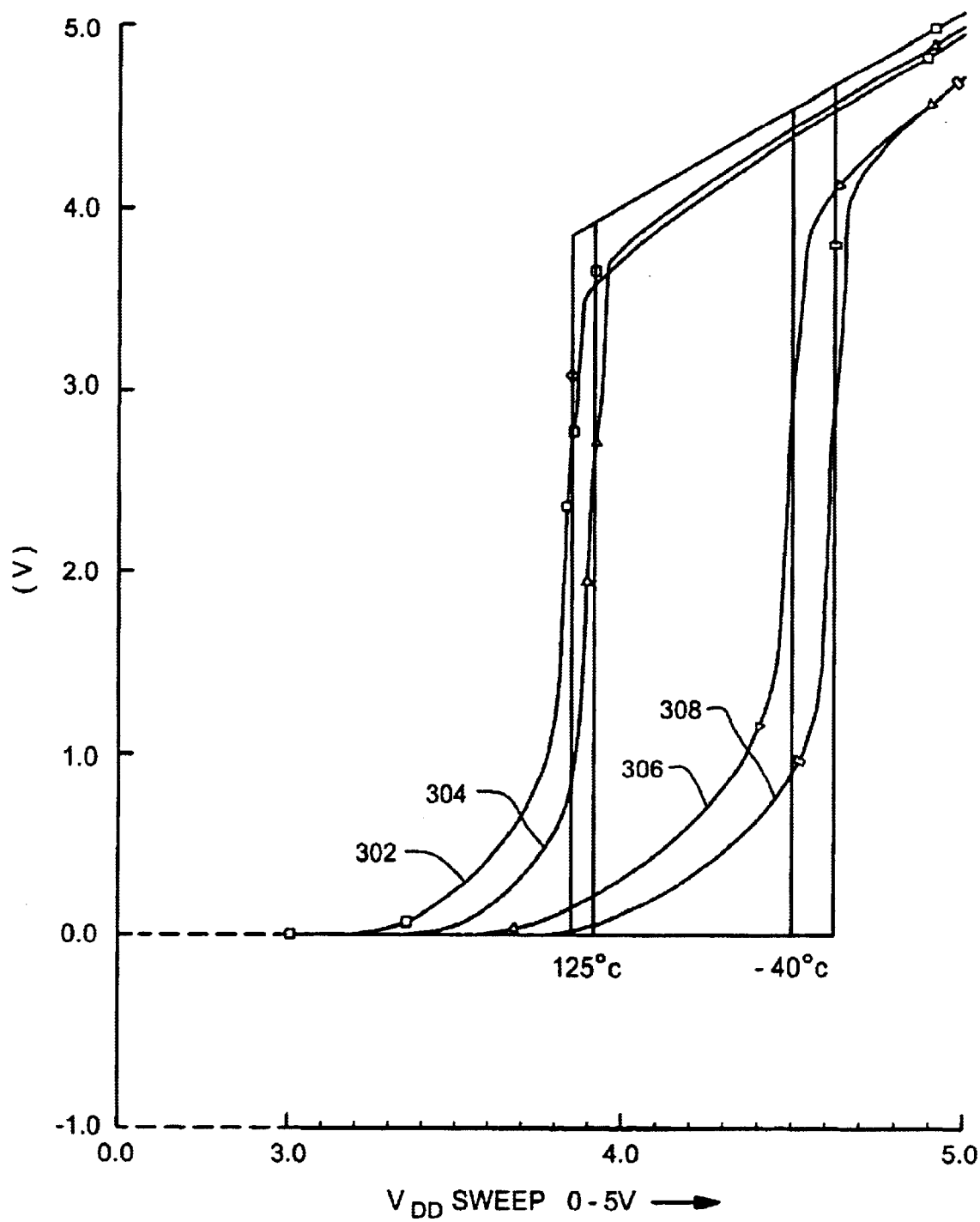
FIG. 3 is a chart illustrating exemplary switch point wave forms associated with simulations of the exemplary voltage detector circuit of FIG. 2 in accordance with embodiments of the present invention.

FIG. 3 is a chart 300 illustrating exemplary switch point wave forms associated with simulations of voltage detector 200 of FIG. 2 in accordance with embodiments of the present invention. It is understood that wave forms 302, 304, 306 and 308 illustrate an exemplary spread of the range over which voltage detector 200 switches in temperature and process. Within chart 300, the horizontal axis represents the voltage value of $V_{DD}$ 104 of voltage detector 200 as it transitions from zero volts to 5V. It is noted that the voltage value of $V_{DD}$ 104 is substantially equal to the voltage value at node 210 of voltage detector 200. Additionally, the vertical axis of chart 300 represents the voltage value of the output of buffer 212 which is represented by output signal 214. It is appreciated that when the voltage value of $V_{DD}$ 104 and node 210 reach a high enough voltage level, buffer 212 switches output signal 214 to a logic "1" (high). Within the present embodiment, bandgap voltage 202 is substantially equal to 2.5V.

Specifically, at 125° Celsius (C), wave form 302 represent a fast silicon process while wave form 304 represents a slow silicon process. It is appreciated that when wave form 302 reaches approximately 3.84V on the horizontal axis, buffer 212 switches output signal 214 to a logic "1" (high). Moreover, when wave form 304 reaches approximately 3.9V on the horizontal axis, buffer 212 switches output signal 214 to a logic "1" (high). Therefore, under these conditions, wave forms 302 and 304 illustrate that voltage detector 200 properly switches between the low voltage range (e.g., 2.7–3.6 volts) and high voltage range (e.g., 4.75–5.25 volts) of $V_{DD}$ 104.

At –40° C., wave form 306 represent a fast silicon process while wave form 308 represents a slow silicon process. It is understood that when wave form 306 reaches approximately 4.5V on the horizontal axis, buffer 212 switches output signal 214 to a logic "1" (high). Furthermore, when wave form 308 reaches approximately 4.62V on the horizontal axis, buffer 212 switches output signal 214 to a logic "1" (high). As such, under these conditions, wave forms 306 and 308 illustrate that voltage detector 200 properly switches between the low voltage range (e.g., 2.7–3.6 volts) and high voltage range (e.g., 4.75–5.25 volts) of $V_{DD}$ 104. It is noted that the transition points (or switch points) of voltage detector 200 are affected by the value of bandgap voltage 202 and the relative W/Ls of transistors 204, 206 and 208. Therefore, the transition points (or switch points) of voltage detector 200 may be moved by changing the voltage value of bandgap voltage 202 and/or the relative W/Ls of transistors 204, 206 and 208 so that voltage detector 200 is suitable for desired high and low voltage ranges of $V_{DD}$ 104.

Figure 4:
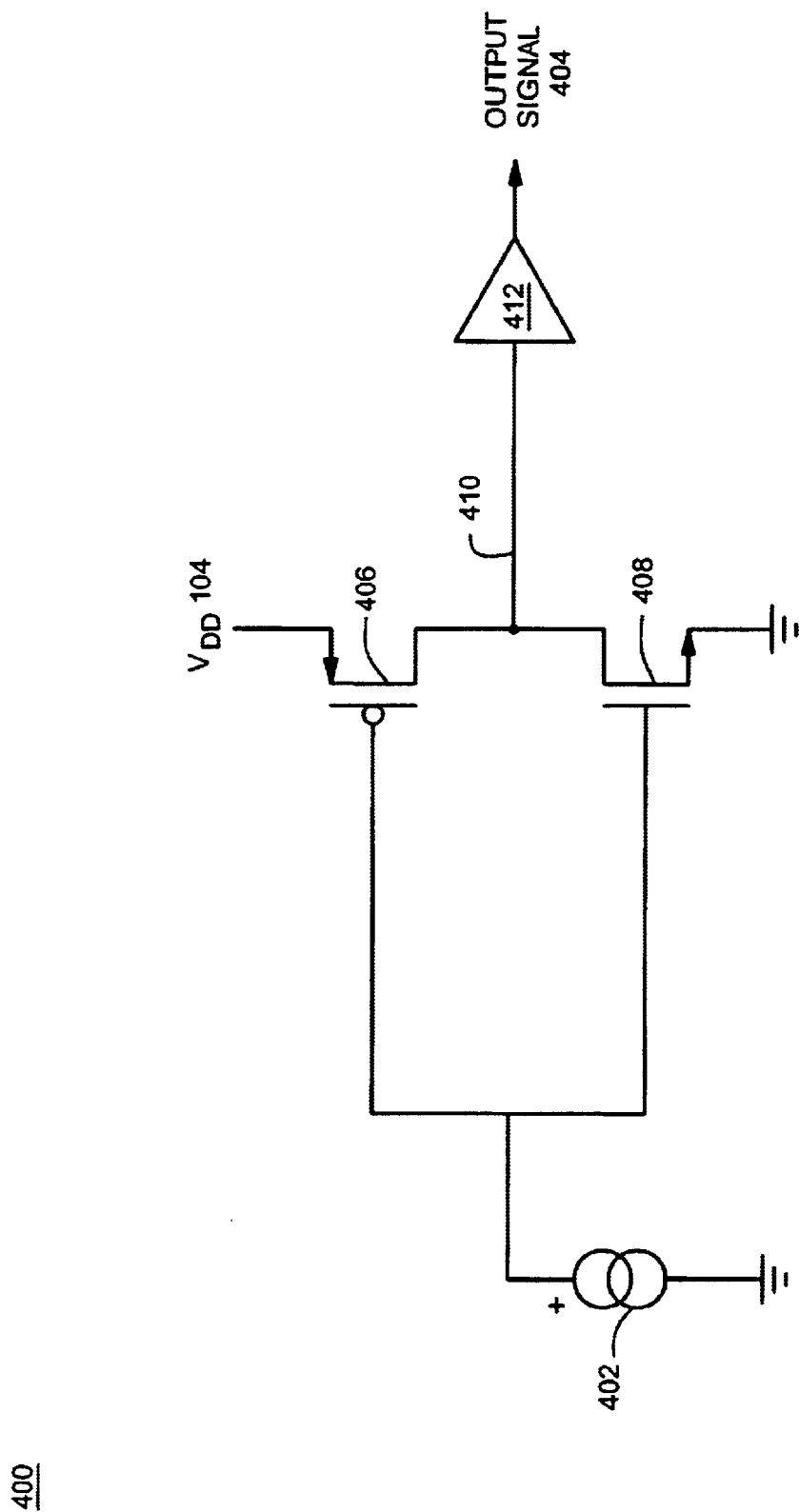
FIG. 4 is a schematic diagram of an exemplary voltage detector circuit in accordance with another embodiment of the present invention.

FIG. 4 is a schematic diagram of an exemplary voltage detector circuit 400 in accordance with an embodiment of the present invention. It is noted that voltage detector circuit 400 may be utilized as an implementation for voltage detector circuit 102 of FIG. 1. The voltage detector circuit 400 of FIG. 4 is designed to detect when $V_{DD}$ 104 is in a high voltage range (e.g., 4.75–5.25 volts) or in a low voltage range (e.g., 2.7–3.6 volts). Generally, when $V_{DD}$ 104 is within the high voltage range, a transistor 406 is turned on hard causing a node 410 to be eventually pulled up to the high voltage level of $V_{DD}$ 104. As such, a buffer circuit 412 produces an output signal 404 which is a logical "1" (high). However, when $V_{DD}$ 104 is within a low voltage range, transistor 406 is softly turned on while transistor 408 is turned on hard thereby pulling node 410 down to ground. As such, buffer circuit 412 produces output signal 404 which is a logical "0" (low).

Specifically, voltage detector circuit 400 includes a bandgap voltage 402 which is a substantially constant voltage over temperature and over process. It is understood that bandgap voltage 402 may be implemented as a wide variety of voltage values. For example, bandgap 402 may be implemented in a manner similar to bandgap 202 of FIG. 2 described herein.

Within FIG. 4, if bandgap voltage 402 is substantially equal to 2.5 V (for example), when $V_{DD}$ 104 is within the high voltage range (e.g., 4.75–5.25 volts), transistor 406 is turned on hard. That is, the gate of transistor 406 is substantially equal to 2.5 V while its source is coupled to $V_{DD}$ 104 within the high voltage range. It is understood that transistor 406 begins turning on and conducting current to node 410 when the voltage value of $V_{DD}$ 104 is greater than the combination of the bandgap voltage 402 plus the threshold voltage of transistor 406. Given $V_{DD}$ 104 is approximately equal to at least 4.75V within the present example, the bandgap voltage 402 is substantially equal to 2.5 V and the threshold voltage of transistor 406 may be 0.5V, transistor 406 turns on hard and conducts current to node 410.

Additionally, when $V_{DD}$ 104 is within the high voltage range, transistor 408 turns on since its gate is at a higher voltage level (e.g., 2.5V) than the combination of its source voltage plus its threshold voltage (e.g., 0.5V). As such, transistor 406 pulls node 410 up to $V_{DD}$ 104 while transistor 408 fights to pull node 410 down to ground. It is noted that transistor 406 eventually succeeds in pulling node 410 up to $V_{DD}$ 104 because it is specifically sized to overpower transistor 408. Transistor 406 may be referred to as a pull-up element of voltage detector 400 while transistor 408 may be referred to as a pull-down element of voltage detector 400. With node 410 pulled up to $V_{DD}$ 104, buffer 412 receives that voltage value and produces output signal 404 as a logic "1" (high) since buffer 412 is a non-inverting buffer. It is appreciated that buffer 412 may also be implemented with hysteresis to provide more stable switching.

It is noted that when $V_{DD}$ 104 is within the high voltage range, transistors 406 and 408 are both strongly turned on resulting in current passing through both of them into ground. In this manner, static current is being pulled to ground and is wasted. This may be a concern when utilizing a limited power supply such as battery power. When reducing wasted current is desirable, voltage detector circuit 200 of FIG. 2 may be utilized instead of voltage detector circuit 400 of FIG. 4.

Within FIG. 4, when $V_{DD}$ 104 is within the low voltage range (e.g., 2.7–3.6 volts) and bandgap voltage 402 is substantially equal to 2.5 V (for example), transistor 406 is turned on softly while transistor 408 is turned on hard thereby pulling node 410 to ground or a logical "0" (low) value. Specifically, the source of transistor 408 is at ground while its gate is substantially equal to 2.5V which is the value of bandgap voltage 402 within the present example. Since the voltage level at the gate of transistor 408 is greater than the combination of its source voltage plus its threshold voltage (e.g., 0.5V), transistor 408 turns on hard causing node 410 to be pulled down to ground.

Additionally, when $V_{DD}$ 104 is within the low voltage range, transistor 406 is substantially turned off if its source voltage is less than the combination of its gate voltage plus its threshold voltage. For example, if the source voltage of transistor 406 is equal to 2.7V, its gate voltage is equal to 2.5V and its threshold voltage equal to 0.5V, transistor 406 would be substantially turned off. As such, transistor 408 pulls node 410 down to ground. With node 410 pulled down to ground or a logic "0" (low) voltage level, buffer 412 receives that voltage value and produces output signal 404 as a logic "0" (low) since buffer 412 is a non-inverting buffer. It is noted that buffer 412 may alternatively be implemented as an inverting buffer.

Within voltage detector circuit 400 of FIG. 4, the positive polarity terminal of bandgap voltage reference 402 is coupled to each of the gates of transistors 406 and 408. Furthermore, the negative polarity terminal of bandgap 402 is coupled to ground or logic "0" (low). The source of transistor 406 is coupled to $V_{DD}$ 104 while its drain is coupled to node 410. The drain of transistor 408 is coupled to node 410 while its source is coupled to ground, e.g., logical "0" (low). The input of buffer 412 is coupled to node 410 while its output is coupled to produce output signal 404.

Within the present embodiment, transistor 406 is implemented as a PMOS while transistor 408 is implemented as a NMOS. However, the present embodiment is not limited to such implementation. It is noted that transistors 406 and 408 can be implemented in different ways in accordance with the present embodiment. For example, transistor 408 may be implemented as, but is not limited to, a NMOS or PMOS device. However, for this change to be implemented, it may involve implementing circuit 400 in a different manner. Transistors 406 and 408 can each be referred to as a switching element. It is understood that buffer circuit 412 may be implemented in diverse ways. For example, buffer circuit 412 may be implemented as, but is not limited to, a Schmitt trigger circuit or two inverter circuits coupled in series. Additionally, buffer circuit 412 can be referred to as a switching element or a buffer element. It is noted that circuit 400 may be implemented in a wide variety of ways.

Figure 5:
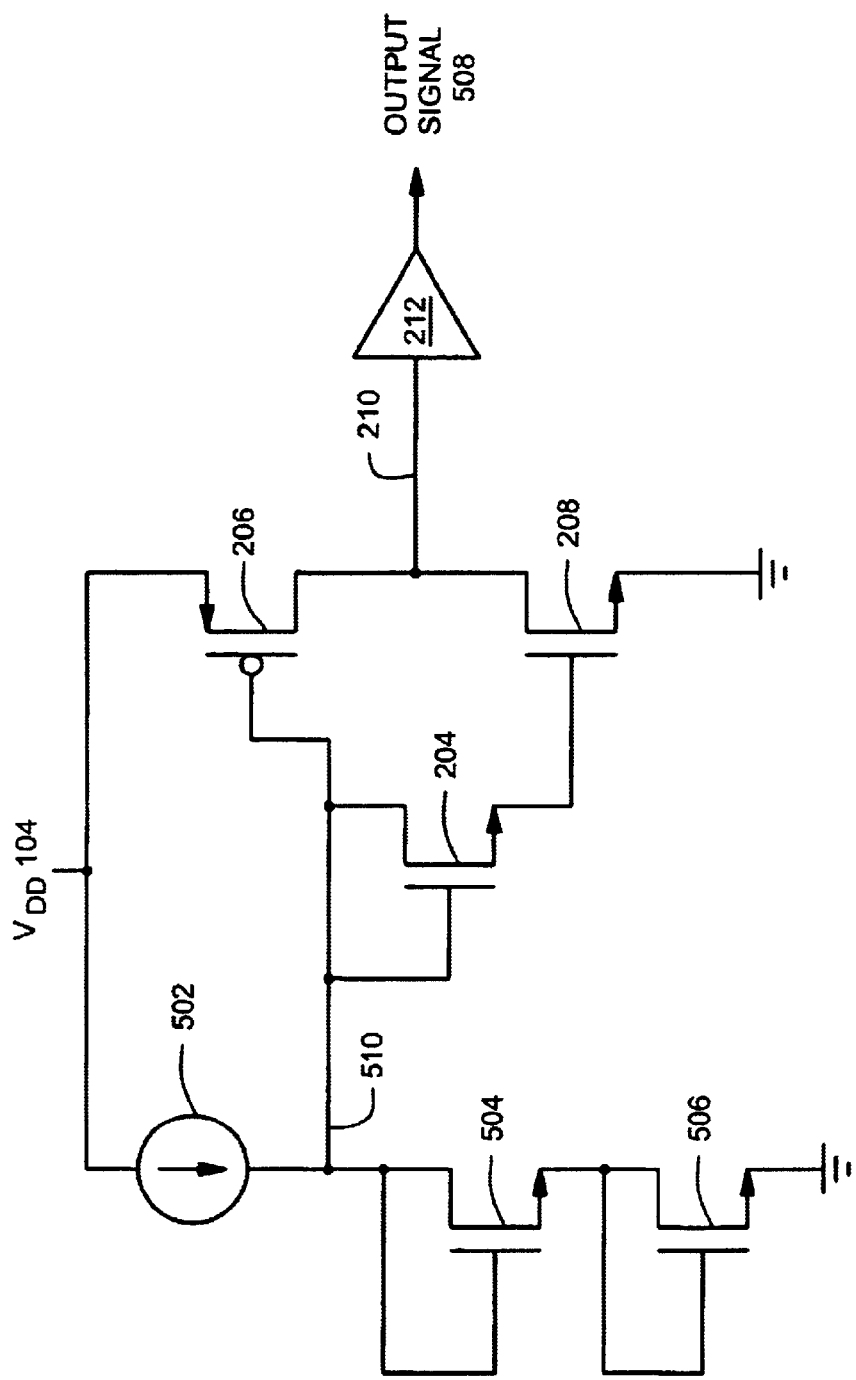
FIG. 5 is a schematic diagram of an exemplary voltage detector circuit in accordance with yet another embodiment of the present invention.

FIG. 5 is a schematic diagram of an exemplary voltage detector circuit 500 in accordance with an embodiment of the present invention. It is noted that voltage detector circuit 500 may be utilized as an implementation for voltage detector circuit 102 of FIG. 1. The voltage detector circuit 500 of FIG. 5 is designed to detect when $V_{DD}$ 104 is in a high voltage range (e.g., 4.75–5.25 volts) or in a low voltage range (e.g., 2.7–3.6 volts). It is appreciated that voltage detector circuit 500 does not utilize a bandgap voltage reference. Instead, a voltage reference is provided at a node 510 by a current source 502 in combination with transistors 504 and 506. Generally, when $V_{DD}$ 104 is within the high voltage range, transistor 206 is turned on hard causing node 210 to be pulled up to the high voltage level of $V_{DD}$ 104. As such, buffer circuit 212 produces an output signal 508 which is a logical "1" (high). However, when $V_{DD}$ 104 is within a low voltage range, transistor 206 may be softly turned on or turned off while transistor 208 is turned on hard thereby pulling node 210 down to ground. As such, buffer circuit 212 produces output signal 508 which is a logical "0" (low).

It is noted that buffer 212 and transistors 204, 206 and 208 of voltage detector 500 operate in a manner similar to buffer 212 and transistors 204, 206 and 208 of voltage detector 200 of FIG. 2 described herein. However, instead of voltage detector 500 of FIG. 5 utilizing a bandgap voltage reference (e.g., 202), a voltage reference is provided at node 510 by current source 502 in combination with transistors 504 and 506.

Specifically, the current output by current source 502 drives transistors 504 and 506 that are diode connected in order to create a voltage drop that can be used as a reference voltage at node 510. It is advisable that the value of reference voltage at node 510 be established between the threshold voltage ($V_T$) of transistor 206 and the lower voltage range of $V_{DD}$ 104. For example, if the lower voltage range of $V_{DD}$ 104 is 2.7V and the threshold voltage of transistor 206 is equal to 0.5V, the reference voltage at node 510 may be substantially equal to 2.3V. Within other embodiments of voltage detector 500, one or more transistors may be diode connected to transistors 504 and 506 in order to establish the desired reference voltage at node 510. Alternatively, voltage detector circuit 500 may be implemented with one diode connected transistor (e.g., transistor 504 or 506) in order to establish the desired reference voltage at node 510.

Within voltage detector circuit 500 of FIG. 5, the source of transistor 506 is coupled to ground (e.g., logical "0") while its gate and drain are coupled to the source of transistor 504. The gate and drain of transistor 504 are coupled to the output of current source 502. Additionally, the gate and drain of transistor 504 are also coupled to the gate of transistor 206 along with the gate and drain of transistor 204. The source of transistor 206 is coupled to $V_{DD}$ 104 while its drain is coupled to node 210. The gate of transistor 208 is coupled to the source of transistor 204, the drain of transistor 208 is coupled to node 210 while its source is coupled to ground (e.g., logical "0"). The input of buffer 212 is coupled to node 210 while its output is coupled to produce output signal 508.

Within the present embodiment, transistor 206 is implemented as a PMOS while transistors 204, 208, 504 and 506 are each implemented as a NMOS. However, the present embodiment is not limited to such implementation. It is noted that transistors 204, 206, 208, 504 and 506 can be implemented in different ways in accordance with the present embodiment. For example, transistors 204, 208, 504 and 506 may each be implemented as, but is not limited to, a NMOS or PMOS device. However, for this change to be implemented, it may involve implementing circuit 500 in a different manner. Transistor 204 can be referred to as a level shifter element. Transistor 206 can be referred to as a pull-up element while transistor 208 can be referred to as a pull-down element. It is noted that transistors 204, 206, 208, 504 and 506 can each be referred to as a switching element. It is noted that circuit 500 may be implemented in a wide variety of ways.

Figure 6:
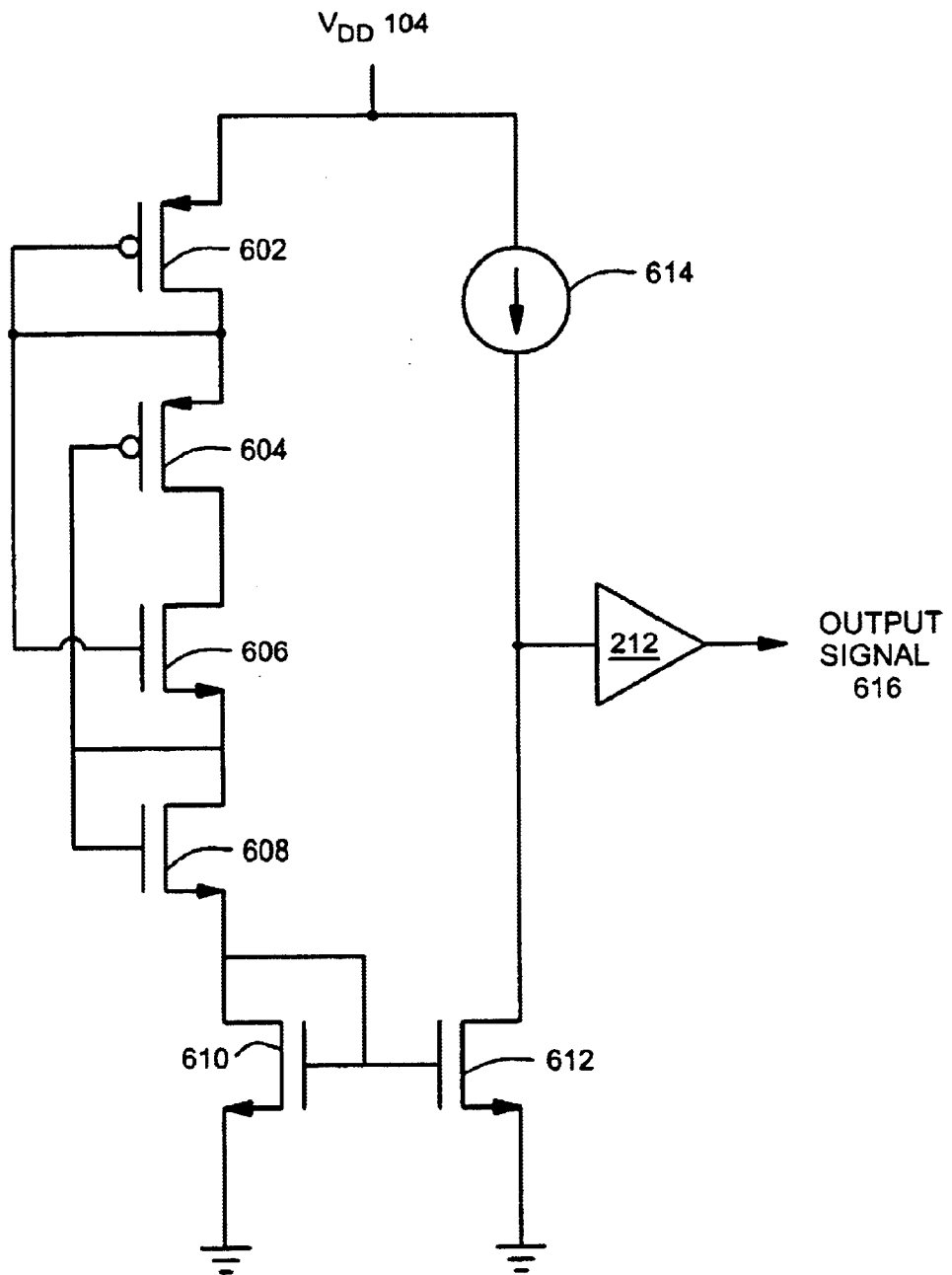
FIG. 6 is a schematic diagram of an exemplary voltage detector circuit in accordance with still another embodiment of the present invention.

FIG. 6 is a schematic diagram of an exemplary voltage detector circuit 600 in accordance with an embodiment of the present invention. It is noted that voltage detector circuit 600 may be utilized as an implementation for voltage detector circuit 102 of FIG. 1. The voltage detector circuit 600 of FIG. 6 is designed to detect when $V_{DD}$ 104 is in a high voltage range (e.g., 4.75–5.25 volts) or in a low voltage range (e.g., 2.7–3.6 volts). Generally, when $V_{DD}$ 104 is within the high voltage range, transistors 602, 604, 606 and 608 that comprise a diode stack element along with transistors 610 and 612 that comprise a current mirror element are turned on causing the input to buffer 212 to be pulled to a lower voltage level. As such, buffer circuit 212 may be implemented as an inverting buffer that receives the lower voltage input and produces an output signal 616 which is a logical "1" (high). However, when $V_{DD}$ 104 is within a low voltage range, transistors 602, 604, 606 and 608 of the diode stack element along with transistors 610 and 612 of the current mirror element are substantially turned off. As such, a current source 614 provides a higher voltage level to the input of buffer 212. Therefore, buffer circuit 212 receives the higher voltage level and produces output signal 616 which is a logical "0" (low).

Specifically, when $V_{DD}$ 104 is within the high voltage range (e.g., 4.75–5.25 volts), transistor 602 turns on when the value of $V_{DD}$ 104 is greater than the combined voltage value of its gate voltage plus its threshold voltage. Once transistor 602 turns on, a portion of the voltage value of $V_{DD}$ 104 will be present at the source of transistor 604 and the gate of transistor 606. As such, transistor 604 turns on when the portion of the voltage value of $V_{DD}$ 104 is greater than the combined voltage value of its gate voltage plus its threshold voltage. Transistor 606 turns on when the voltage value of its gate is greater than the combined voltage value of its source plus its threshold voltage. Once transistor 606 turns on, a smaller portion of the voltage value of $V_{DD}$ 104 will be present at the gate and drain of transistor 608. Transistor 608 turns on when the voltage value of its gate is greater than the combined voltage value of its source plus its threshold voltage.

Once transistor 608 of FIG. 6 turns on, an even smaller portion of the voltage value of $V_{DD}$ 104 will be present at the drain and gate of transistor 610. Transistor 610 turns on when the voltage value of its gate is greater than the combined voltage value of its source plus its threshold voltage. The voltage value at the drain and gate of transistor 610 also exists at the gate of transistor 612. As such, transistor 612 turns on when the voltage value at its gate is greater than the combined voltage value of its source plus its threshold voltage. When transistor 612 turns on it pulls the input to buffer 212 to a lower voltage level. Consequently, there is a voltage drop at the input of buffer 212 as the diode stack overcomes the current output by current source 614. As such, buffer circuit 212 receives the lower voltage input and produces output signal 616 which is a logical "1" (high). It is noted that buffer 212 of the present embodiment is implemented as an inverting buffer. Alternatively, buffer 212 may be implemented as a non-inverting buffer. It is further noted that transistors 604 and 606 are coupled in the manner shown in order to keep the diode stack above a sub-threshold condition.

When $V_{DD}$ 104 is within the low voltage range (e.g., 2.7–3.6 volts), there is not enough voltage to turn on the diode stack of transistors 602, 604, 606 and 608 along with transistor 610 of the current mirror. As such, with transistors 602, 604, 606, 608, 610 and 612 turned off, current source 614 provides a higher voltage level to the input of buffer 212. Therefore, buffer circuit 212 receives the higher voltage level and produces output signal 616 which is a logical "0" (low).

Within voltage detector circuit 600 of FIG. 6, the source of transistor 602 is coupled to $V_{DD}$ 104 while its gate and drain are coupled to the source of transistor 604. Furthermore, the gate and drain of transistor 602 are coupled to the gate of transistor 606. The gate of transistor 604 is coupled to the gate and drain of transistor 608 along with the source of transistor 606. The drain of transistor 606 is coupled to the drain of transistor 604. The source of transistor 608 is coupled to the drain and gate of transistor 610 and the gate of transistor 612. Additionally, the source of transistor 610 is coupled to ground (e.g., logical zero) while its gate is coupled to the gate of transistor 612. The source of transistor 612 is coupled to ground (e.g., logical zero) while its drain is coupled to the input of buffer 212 and the output of current source 614. The input of current source 614 is coupled to $V_{DD}$ 104 while the output of buffer 212 is coupled to produce output signal 616.

Within the present embodiment, transistors 602 and 604 are each implemented as a PMOS while transistors 606, 608, 610 and 612 are each implemented as a NMOS. However, the present embodiment is not limited to such implementation. It is noted that transistors 602, 604, 606, 608, 610 and 612 can be implemented in different ways in accordance with the present embodiment. For example, transistors 602, 604, 606, 608, 610 and 612 may each be implemented as, but is not limited to, a PMOS or NMOS device. However, for this change to be implemented, it may involve implementing circuit 600 in a different manner. Transistors 602, 604, 606 and 608 can be referred to as a diode stack element. Transistors 610 and 612 can be referred to as a current mirror element. It is noted that transistors 602, 604, 606, 608, 610 and 612 can each be referred to as a switching element. It is noted that circuit 600 may be implemented in a wide variety of ways.

Figure 7:
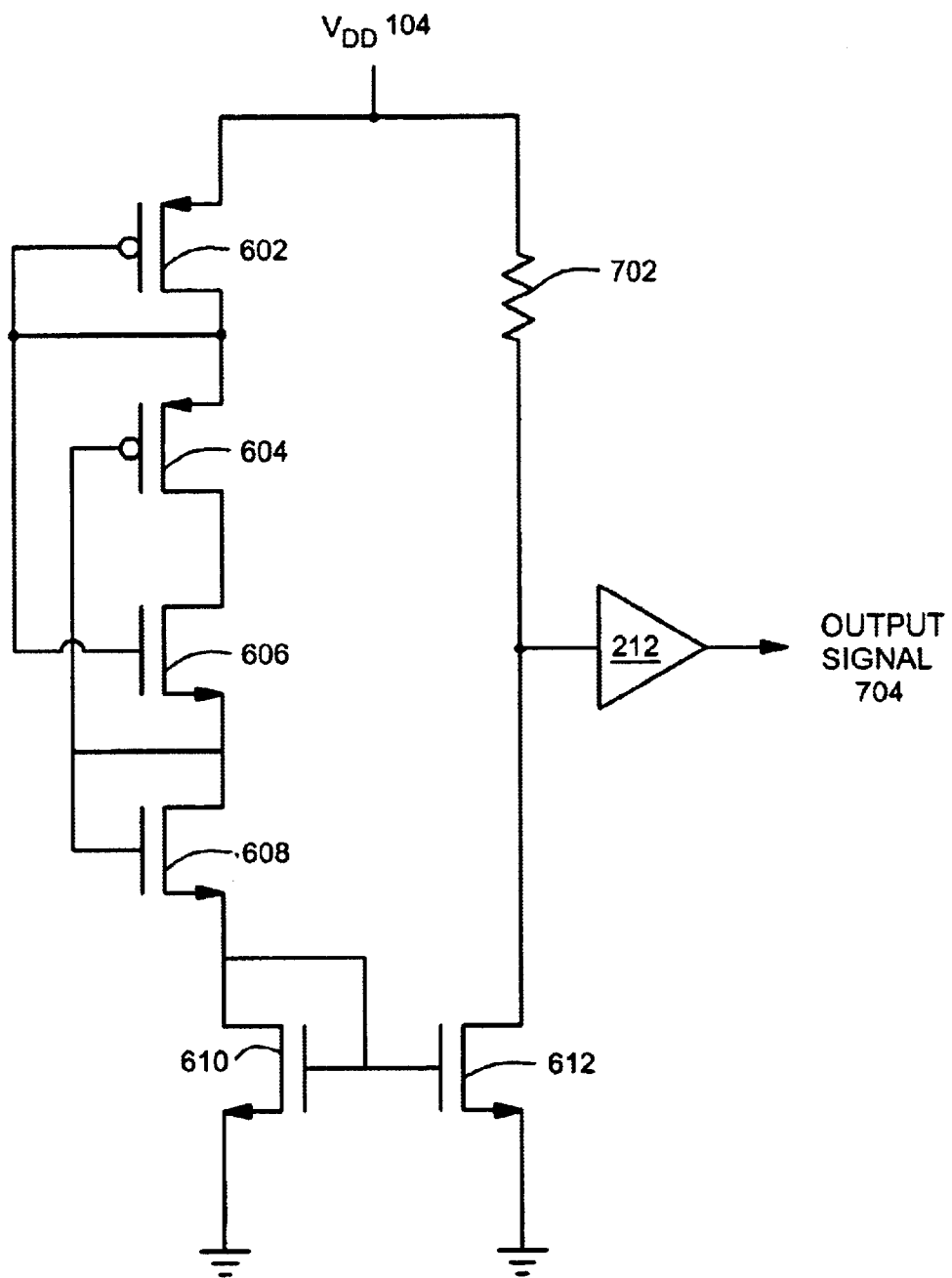
FIG. 7 is a schematic diagram of an exemplary voltage detector circuit in accordance with still yet another embodiment of the present invention.

FIG. 7 is a schematic diagram of an exemplary voltage detector circuit 700 in accordance with an embodiment of the present invention. It is noted that voltage detector circuit 700 may be utilized as an implementation for voltage detector circuit 102 of FIG. 1. The voltage detector circuit 700 of FIG. 7 is designed to detect when $V_{DD}$ 104 is in a high voltage range (e.g., 4.75–5.25 volts) or in a low voltage range (e.g., 2.7–3.6 volts). Generally, when $V_{DD}$ 104 is within the high voltage range, transistors 602, 604, 606 and 608 that comprise a diode stack element along with transistors 610 and 612 that comprise a current mirror element are turned on causing the input to buffer 212 to be pulled to a low voltage level. As such, buffer circuit 212 may be implemented as an inverting buffer that receives the low voltage signal and produces an output signal 704 as a logical "1" (high). However, when $V_{DD}$ 104 is within a low voltage range, transistors 602, 604, 606 and 608 of the diode stack element along with transistors 610 and 612 of the current mirror element are substantially turned off. As such, $V_{DD}$ 104 provides a higher voltage level to the input of buffer 212 through a resistor 702. Therefore, buffer circuit 212 produces output signal 704 as a logical "0" (low).

It is noted that buffer 212 and transistors 602, 604, 606, 608, 610 and 612 of voltage detector 700 operate in a manner similar to buffer 212 and transistors 602, 604, 606, 608, 610 and 612 of voltage detector 600 of FIG. 6 described herein. However, voltage detector 700 of FIG. 7 includes resistor 702 and does not include a current source (e.g. 614). It is understood that buffer 212 may be implemented as a non-inverting buffer.

Specifically, when $V_{DD}$ 104 is within the high voltage range (e.g., 4.75–5.25 volts), transistors 602, 604, 606 and 608 of the diode stack along with transistors 610 and 612 of the current mirror turn on. As such, the current drawn through transistors 602, 604, 606 and 608 of the diode stack is mirrored by transistors 610 and 612 of the current mirror thereby causing a mirror current to pass through resistor 702 and transistor 612 to ground. Consequently, there is a voltage drop at the input of buffer 212. The buffer 212 receives the lower voltage level and produces output signal 704 as a logic "1" (high).

Within FIG. 7, when $V_{DD}$ 104 is within the low voltage range (e.g., 2.7–3.6 volts), transistors 602, 604, 606 and 608 of the diode stack along with transistors 610 and 612 of the current mirror are substantially turned off. As such, little current flows through resistor 702 and transistor 612 to ground. Therefore, $V_{DD}$ 104 provides a higher voltage level to the input of buffer 212 through resistor 702. The buffer 212 detects the high voltage level and produces output signal 704 as a logic "0" (low).

Within voltage detector circuit 700, a first terminal of resistor 702 is coupled to $V_{DD}$ 104 and the source of transistor 602. Additionally, a second terminal of resistor 702 is coupled to the input of buffer 212 and the drain of transistor 612. The output of buffer 212 is coupled to produce output signal 704. The source of transistor 602 is coupled to $V_{DD}$ 104 while its gate and drain are coupled to the source of transistor 604. Furthermore, the gate and drain of transistor 602 are coupled to the gate of transistor 606. The gate of transistor 604 is coupled to the gate and drain of transistor 608 along with the source of transistor 606. The drain of transistor 606 is coupled to the drain of transistor 604. The source of transistor 608 is coupled to the drain and gate of transistor 610 and the gate of transistor 612. Additionally, the source of transistor 610 is coupled to ground (e.g., logical zero) while its gate is coupled to the gate of transistor 612. The source of transistor 612 is coupled to ground (e.g., logical zero) while its drain is coupled to the input of buffer 212 and the second terminal of resistor 702.

Within the present embodiment of FIG. 7, transistors 602 and 604 are each implemented as a PMOS while transistors 606, 608, 610 and 612 are each implemented as a NMOS. However, the present embodiment is not limited to such implementation. It is noted that transistors 602, 604, 606, 608, 610 and 612 can be implemented in different ways in accordance with the present embodiment. For example, transistors 602, 604, 606, 608, 610 and 612 may each be implemented as, but is not limited to, a PMOS or NMOS device. However, for this change to be implemented, it may involve implementing circuit 700 in a different manner. Transistors 602, 604, 606 and 608 can be referred to as a diode stack element. Transistors 610 and 612 can be referred to as a current mirror element. It is noted that transistors 602, 604, 606, 608, 610 and 612 can each be referred to as a switching element. It is noted that circuit 700 may be implemented in a wide variety of ways.

Figure 8:
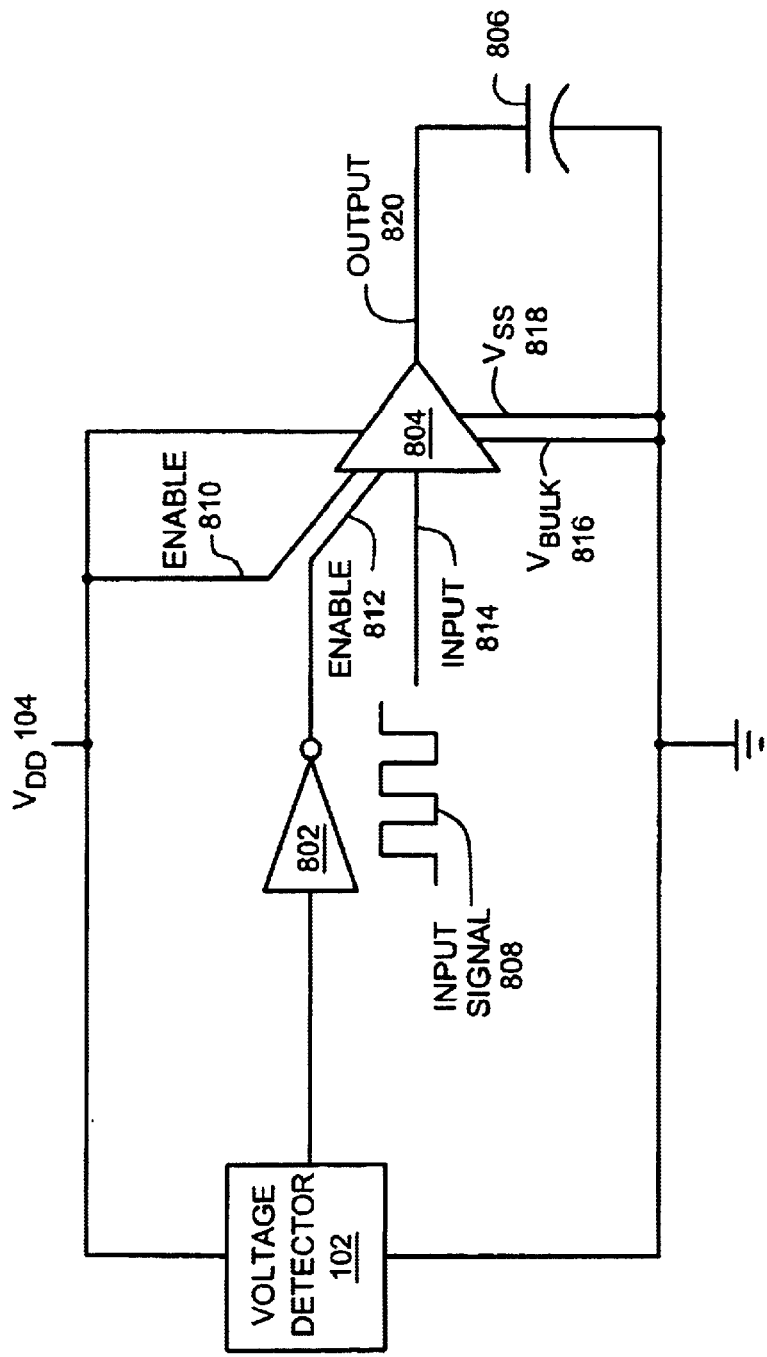
FIG. 8 is a diagram of an exemplary circuit that includes a voltage detector circuit combined with a variable drive strength buffer circuit in accordance with an embodiment of the present invention.

FIG. 8 is a diagram of an exemplary circuit 800 that includes a voltage detector circuit (e.g., 102) combined with a variable drive strength buffer circuit 804 in accordance with an embodiment of the present invention. Within the circuit 800, it is noted that voltage detector 102 is coupled to operate in conjunction with variable drive strength buffer circuit 804. It is noted that variable drive strength buffer circuit 804 can be referred to as a variable drive strength output driver circuit. Within circuit 800, it is understood that supply voltage ($V_{DD}$) 104 can be within a high voltage range (e.g., 4.75–5.25 volts) or within a low voltage range (e.g., 2.7–3.6 volts). As such, when voltage detector circuit 102 detects $V_{DD}$ 104 within the low voltage range, it causes variable drive strength buffer circuit 804 to provide more drive (e.g., effective W/L) at its output 820. However, when voltage detector circuit 102 detects $V_{DD}$ 104 within the high voltage range, it causes variable drive strength buffer circuit 804 to provide less drive (e.g., effective W/L) at its output 820. In this manner, the size of the current spikes at output 820 are reduced when $V_{DD}$ 104 is within the high voltage range. Additionally, with an exemplary input signal 808 (e.g., square wave) driving variable drive strength buffer 804, the rise/fall time variations are smaller between $V_{DD}$ 104 in the high voltage range and $V_{DD}$ 104 in the low voltage range.

Within the present embodiment, it is noted that variable drive strength buffer 804 can include two separate buffer circuits (not shown). For example, a first buffer circuit of variable drive strength buffer 804 may be active whether $V_{DD}$ 104 is within the low or high voltage range while its second buffer circuit may just be activated when voltage detector 102 detects $V_{DD}$ 104 within the low voltage range (e.g., 2.7–3.6 volts). Specifically, an enable input 810 of variable drive strength buffer 804 is coupled to $V_{DD}$ 104 causing the first buffer circuit to be active whether $V_{DD}$ 104 is within the low or high voltage range. Conversely, an enable input 812 of variable drive strength buffer 804 is coupled to the second buffer circuit. As such, when voltage detector 102 determines $V_{DD}$ 104 is within the low voltage range, enable input 812 receives an output signal from voltage detector 102 via an inverter circuit 802 that subsequently activates the second buffer circuit of variable drive strength buffer 804.

Alternatively, it is noted that variable drive strength buffer 804 may be implemented as two separate buffer circuits. For example, one of the separate buffer circuits may operate in a manner similar to the first buffer circuit of variable drive strength buffer 804 described herein. Furthermore, the other separate buffer circuit may operate in a manner similar to the second buffer circuit of variable drive strength buffer 804 described herein.

Within FIG. 8, when $V_{DD}$ 104 is within the low voltage range (e.g., 2.7–3.6 volts), voltage detector circuit 102 detects this condition and outputs a logic "0" (low) signal that is received by inverter circuit 802. As such, inverter 802 converts the received logic "0" (low) signal into a logic "1" (high) signal that it outputs to enable input 812 of variable drive strength buffer 804. Since enable input 810 of variable drive strength buffer 804 is a logic "1" (high) and enable input 812 is a logic "1" (high), variable drive strength buffer 804 provides more voltage drive (e.g., effective W/L) to a capacitor 806 via output 820. It is noted that capacitor 806 is an exemplary load to be driven by variable drive strength buffer 804. As such, variable drive strength buffer 804 may drive a wide variety of different types of loads in accordance with the present embodiment. It is understood that input signal 808 (e.g., square wave) is an exemplary signal utilized to provide a rising edge signal to variable drive strength buffer 804.

When $V_{DD}$ 104 is within the high voltage range (e.g., 4.75–5.25 volts), voltage detector circuit 102 detects this condition and outputs a logic "1" (high) signal that is received by inverter circuit 802. As such, inverter 802 converts the received logic "1" (high) signal into a logic "0" (low) signal that it outputs to enable input 812 of variable drive strength buffer 804. Since enable input 810 of variable drive strength buffer 804 is a logic "1" (high) and enable input 812 is a logic "0" (low), variable drive strength buffer 804 provides less voltage drive (e.g., effective W/L) to capacitor 806 via output 820. As such, the size of the current spikes at output 820 are reduced when $V_{DD}$ 104 is within the high voltage range. Additionally, with input signal 808 driving variable drive strength buffer 804, the rise/fall time variations are smaller between $V_{DD}$ 104 in the high voltage range and $V_{DD}$ 104 in the low voltage range.

Within circuit 800 of FIG. 8, $V_{DD}$ 104 is coupled to voltage detector 102 and variable drive strength buffer 804. Additionally, the enable input 810 of variable drive strength buffer 804 is also coupled to $V_{DD}$ 104. The output of voltage detector 102 is coupled to an input of inverter 802 while voltage detector 102 is also coupled to ground (e.g., logical zero). The output of inverter 802 is coupled to the enable input 812 of variable drive strength buffer 804. The variable drive strength buffer 804 includes a $V_{SS}$ output 818 and a bulk connection ($V_{Bulk}$) 816 that are each coupled to ground (e.g., logical zero), However, it is noted that $V_{Bulk}$ 816 of variable drive strength buffer 804 can be brought out separately in order to isolate ground noise. For example, $V_{Bulk}$ 816 can be coupled to its own wire that can be coupled to a ground pin. Alternatively, $V_{Bulk}$ 816 may be coupled to ground in a manner similar to $V_{SS}$ 818.

The input 814 of variable drive strength buffer 804 is coupled to receive input signal 808 while output 820 is coupled to a first terminal of capacitor 806. A second terminal of capacitor 806 is coupled to ground (e.g., logical zero). Even though it is not shown in FIG. 8, it is understood that inverter 802 can be coupled to $V_{DD}$ 104 and it can also have a bulk connection ($V_{Bulk}$) and/or a $V_{SS}$ output coupled to ground (e.g., logical zero). Alternatively, circuit 800 may be implemented without inverter 802. The input signal 808 may be implemented as a square wave signal that transitions from approximately zero volts to the voltage value of $V_{DD}$ 104. However, input signal 808 is not in any way limited to this particular embodiment. As such, input signal 808 may be implemented in a wide variety of ways in accordance with the present embodiment. It is noted that there are a wide variety of ways for implementing variable drive strength buffer 804 in accordance with the present embodiment. It is noted that circuit 800 may be implemented in a wide variety of ways.

Within FIG. 8, it is appreciated that voltage detector circuit 102 may be implemented in any manner similar to that described herein. For example, voltage detector 102 may be implemented as, but is not limited to, voltage detector circuit 200, 400, 500, 600 or 700.

Figure 9:
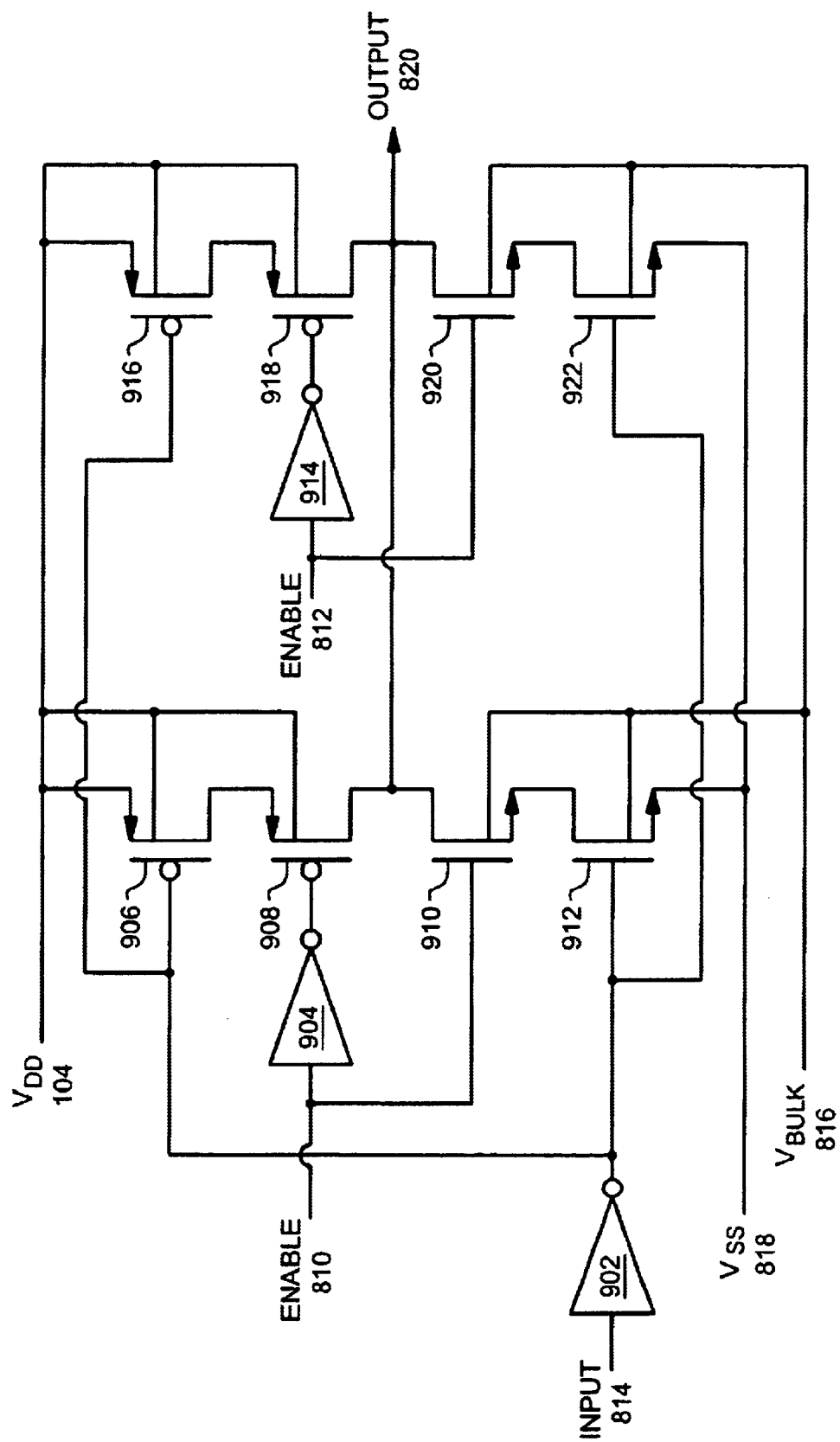
FIG. 9 is a schematic diagram of an exemplary variable drive strength buffer circuit in accordance with an embodiment of the present invention.

FIG. 9 is a schematic diagram of an exemplary variable drive strength buffer circuit 900 in accordance with an embodiment of the present invention. It is noted that variable drive strength buffer circuit 900 may be utilized as an implementation for variable drive strength buffer circuit 804 of FIG. 8. The variable drive strength buffer circuit 900 of FIG. 9 can be referred to as a variable drive strength output driver circuit. The variable drive strength buffer circuit 900 has been implemented as a tri-stateable buffer having dual drive strengths. As such, when enable inputs 810 and 812 are each at a logic "1" (high) level and input 814 is driven, transistors 906, 908, 910, 912, 916, 918, 920 and 922 operate to provide a stronger drive strength (e.g., effective W/L) at output 820. However, when enable input 812 is a logic "0" (low) and enable input 810 is a logic "1" (high) and input 814 is driven, transistors 906, 908, 910 and 912 operate to provide a reduced drive strength (e.g., effective W/L) at output 820. It is noted that the operation of variable drive strength buffer circuit 900 is well known by those of ordinary skill in the art.

It is understood that variable drive strength buffer circuit 900 may be implemented in diverse ways in accordance with the present embodiment. For example, variable drive strength buffer circuit 900 may be implemented with more than two drive strengths levels (e.g., N drive levels). Furthermore, within the present embodiment, variable drive strength buffer circuit 900 is a tri-stateable buffer. It is appreciated that the variable drive strength buffer circuit 900 is implemented as a non-inverting buffer. However, variable drive strength buffer circuit 900 may be implemented as an inverting buffer.

Within variable drive strength buffer 900 of FIG. 9, input 814 is coupled to the input of inverter 902 while its output is coupled to the gates of transistors 906, 916, 912 and 922. The input of inverter 904 is coupled to enable 810 and the gate of transistor 910. The output of inverter 904 is coupled to the gate of transistor 908. Furthermore, the input of inverter 914 is coupled to enable 812 and the gate of transistor 920. The output of inverter 914 is coupled to the gate of transistor 918. The source of transistor 906 is coupled to $V_{DD}$ 104 while its drain is coupled to the source of transistor 908. The drain of transistor 908 is coupled to the drains of transistors 910, 918 and 920 along with output 820. The source of transistor 910 is coupled to the drain of transistor 912 while the source of transistor 912 is coupled to $V_{SS}$ 818. The source of transistor 916 is coupled to $V_{DD}$ 104 while its drain is coupled to the source of transistor 918. The source of transistor 920 is coupled to the drain of transistor 922 while the source of transistor 922 is coupled to $V_{SS}$ 818. It is noted that the substrates of transistors 906, 908, 916 and 918 are each coupled to $V_{DD}$ 104. Additionally, the substrates of transistors 910, 912, 920 and 922 are each coupled to $V_{Bulk}$ 816.

Within the present embodiment, transistors 906, 908, 916 and 918 are each implemented as a PMOS while transistors 910, 912, 920 and 922 are each implemented as a NMOS. However, the present embodiment is not limited to such implementation. It is noted that transistors 906, 908, 910, 912, 916, 918, 920 and 922 can be implemented in different ways in accordance with the present embodiment. For example, transistors 906, 908, 910, 912, 916, 918, 920 and 922 may each be implemented as, but is not limited to, a PMOS or NMOS device. However, for this change to be implemented, it may involve implementing circuit 900 in a different manner. It is noted that transistors 906, 908, 910, 912, 916, 918, 920 and 922 can each be referred to as a switching element. It is noted that circuit 900 may be implemented in a wide variety of ways.

Within variable drive strength buffer circuit 900, even though it is not shown within FIG. 9, it is understood that inverters 902, 904 and 914 can each be coupled to $V_{DD}$ 104. Furthermore, inverters 902, 904 and 914 can each have a bulk connection ($V_{Bulk}$) and/or a $V_{SS}$ output coupled to ground (e.g., logical zero).

Figure 10:
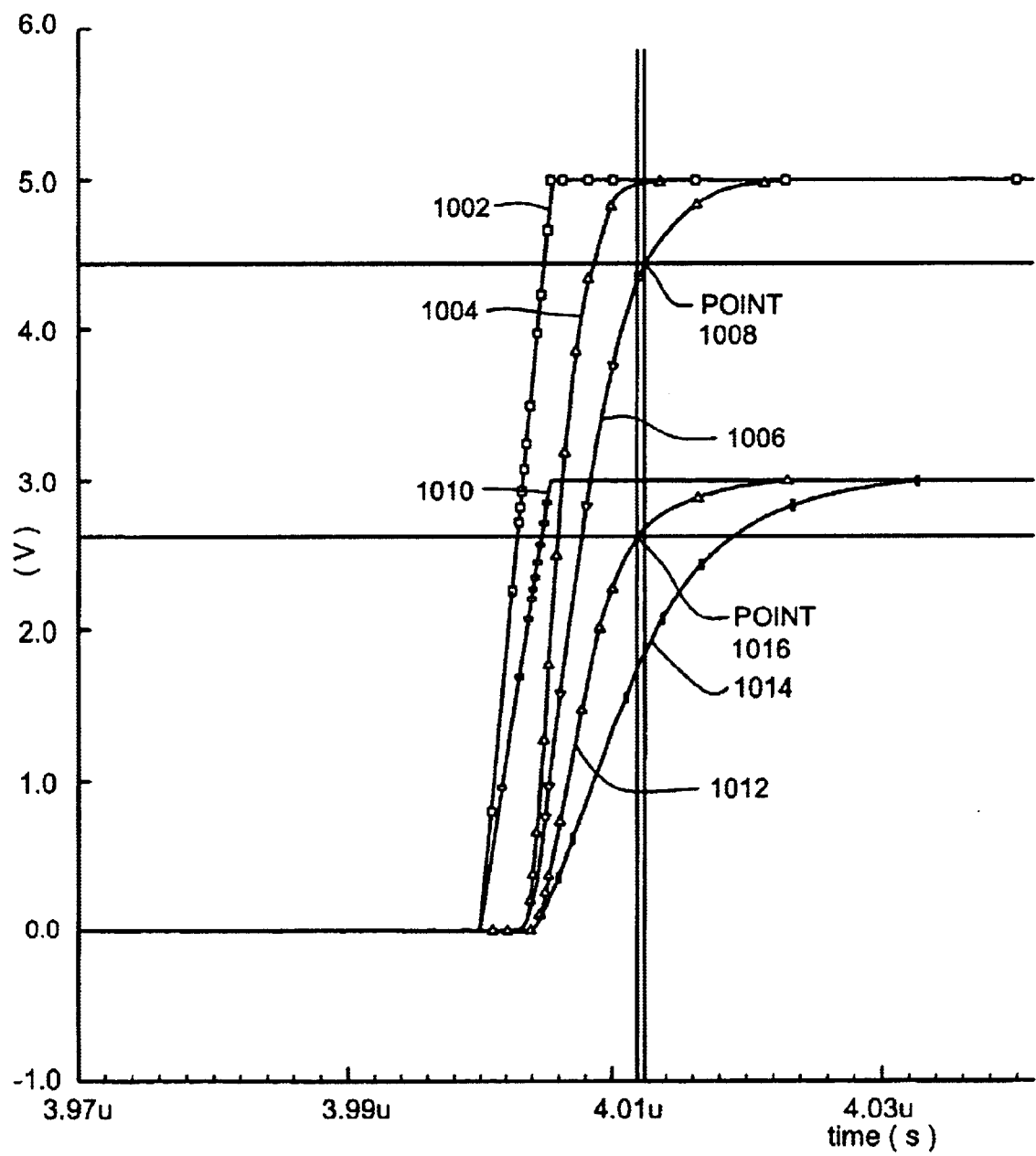
FIG. 10 is a chart illustrating rise time wave forms that may occur in accordance with an embodiment of the present invention.

FIG. 10 is a chart 1000 illustrating rise time wave forms that may occur in accordance with an embodiment of the present invention. It is appreciated that FIG. 10 is described in conjunction with FIGS. 2, 8 and 9 to provide a better understanding of FIG. 10. Furthermore, chart 1000 is a result of running different simulations of circuit 800 implemented in combination with a circuit similar to variable drive strength buffer circuit 900. Additionally, it is noted that voltage detector 102 of circuit 800 is implemented in a manner similar to voltage detector circuit 200 of FIG. 2 wherein bandgap reference voltage 202 is substantially equal to 2.5V.

Specifically, wave form 1002 represents a rising edge signal (e.g., 808) at buffer input 814 when $V_{DD}$ 104 is substantially equal to 5V within circuit 800 and variable drive strength buffer circuit 900. As such, if voltage detector 102 is disabled and both enables 810 and 812 are each at a logic "1" (high), wave form 1004 represents how quickly the voltage level at output 820 rises to the 5V level which is undesirable. However, if $V_{DD}$ 104 is substantially equal to 5V and voltage detector 102 is activated in accordance with an embodiment of the present invention, enable 812 is at a logic "0" (low) while enable 810 has a logic "1" (high). Therefore, wave form 1006 illustrates the slower voltage rise time to 5V at output 820 which is desirable since the current at output 820 has been reduced.

Furthermore, wave form 1010 represents a rising edge signal (e.g., 808) at buffer input 814 when $V_{DD}$ 104 is substantially equal to 3V within circuit 800 and variable drive strength buffer circuit 900. As such, if voltage detector 102 is disabled and enable 812 is at a logic "0" (low) while enable 810 has a logic "1" (high), wave form 1014 represent how slowly the voltage level at output 820 rises to the 3V level which is undesirable. However, with voltage detector 102 activated in accordance with an embodiment of the present invention, both enables 810 and 812 are each at a logic "1" (high). Therefore, wave form 1012 represents how much quicker the rise time is at output 820 to reach 3V which is desirable.

Within FIG. 10, it is noted that a point 1008 represents the rise time of wave form 1006 to reach 90% of 5V. Additionally, a point 1016 represents the rise time of wave form 1012 to reach 90% of 3V. Therefore, it is understood that the rise time of wave form 1006 to reach 90% of 5V is substantially equal to the rise time of wave form 1012 to reach 90% of 3V which is desirable. It is noted that this desirable result is accomplished when voltage detector 102 operates within circuit 800 in accordance with an embodiment of the present invention. Therefore, variable drive strength buffer 804 of circuit 800 produces a substantially equal rise time for two different $V_{DD}$ 104 voltage cases.

Chart 1000 includes a vertical axis that represents voltage value while its horizontal axis represents time in microseconds. As part of producing chart 1000, it is noted that buffer input 814 had a 5 nanosecond rise time in both the 5V and 3V cases. It is understood that chart 1000 represents a "typical" silicon process performed at 27° Celsius (C). Additionally, capacitor 806 of circuit 800 is substantially equal to a 20 picofarad capacitive load.

Figure 11:
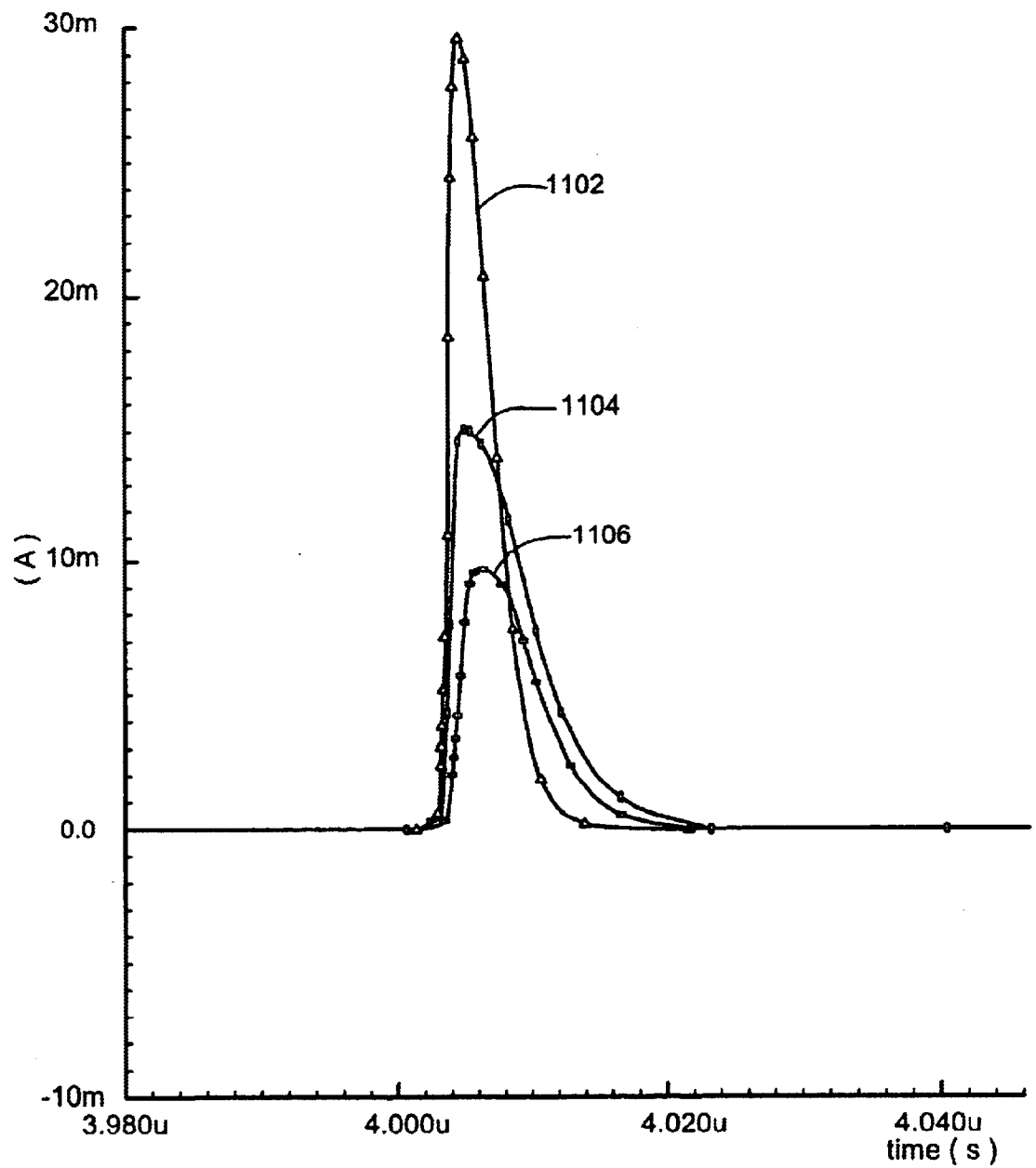
FIG. 11 is a chart illustrating current wave forms that may occur in accordance with an embodiment of the present invention.

FIG. 11 is a chart 1100 illustrating current wave forms that may occur in accordance with an embodiment of the present invention. It is noted that chart 1100 may be produced by utilizing similar circuit configurations and situations as those described with reference to chart 1000 of FIG. 10. Chart 1100 of FIG. 11 includes a vertical axis that represents current value in milliamperes while its horizontal axis represents time in microseconds.

Specifically, if $V_{DD}$ 104 is substantially equal to 5V, voltage detector 102 of circuit 800 is disabled and both enables 810 and 812 are each at a logic "1" (high), wave form 1102 represents an undesirable current spike that may occur at the $V_{DD}$ 104 input of variable drive strength buffer circuit 804. However, if $V_{DD}$ 104 is substantially equal to 5V and voltage detector 102 is activated in accordance with an embodiment of the present invention, enable 812 is at a logic "0" (low) while enable 810 has a logic "1" (high). As such, wave form 1104 represents a more desirable reduced current spike that may occur at the $V_{DD}$ 104 input of variable drive strength buffer circuit 804.

Additionally, if $V_{DD}$ 104 is substantially equal to 3V and voltage detector 102 is activated in accordance with an embodiment of the present invention, enables 810 and 812 are each at a logic "1" (high). Therefore, wave form 1106 represents a current spike that may occur at the $V_{DD}$ 104 input of variable drive strength buffer circuit 804. It is noted that wave form 1106 has been included for comparison to wave forms 1102 and 1104. As such, chart 1100 illustrates that by utilizing voltage detector 102 in combination with variable drive strength buffer circuit 804, the current spikes are able to be reduced to an acceptable level when $V_{DD}$ 104 is substantially equal to 5V.

Figure 12:
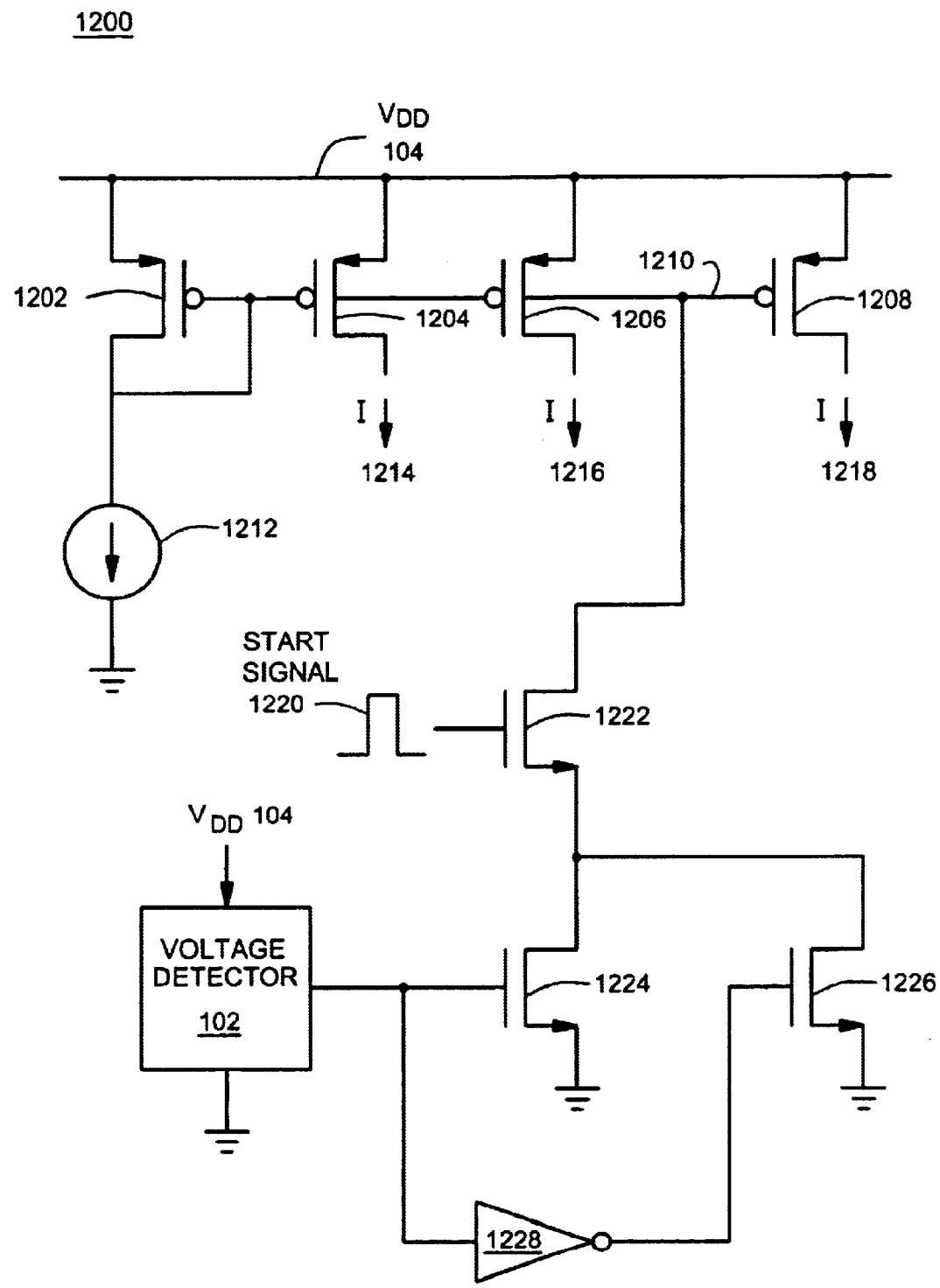
FIG. 12 is a diagram of an exemplary circuit that includes a voltage detector circuit combined with a start up circuit in accordance with an embodiment of the present invention.

FIG. 12 is a schematic diagram of an exemplary circuit 1200 that includes a voltage detector circuit (e.g., 102) combined with a start up circuit in accordance with an embodiment of the present invention. Within circuit 1200, it is noted that voltage detector 102 is coupled to operate in conjunction with a start up circuit and transistors 1202, 1204, 1206 and 1208 that make up a bias current generator array. Additionally, it is understood that supply voltage ($V_{DD}$) 104 can be within a high voltage range (e.g., 4.75–5.25 volts) or within a low voltage range (e.g., 2.7–3.6 volts). As such, voltage detector circuit 102 enables the start up to be tailored such when $V_{DD}$ 104 is in the high voltage range, the strength of the pull down of a node 1210 is not as hard (or as strong) as when $V_{DD}$ 104 is in the low voltage range. As such, the start up may be tailored to be fast enough when $V_{DD}$ 104 is within both voltage ranges without causing excessive current spikes in "start up" currents 1214, 1216 and 1218.

For example, when voltage detector circuit 102 detects $V_{DD}$ 104 within the low voltage range and a start signal 1220 is received by a transistor 1222, node 1210 is pulled down part way to ground (or a logical low) by activating a transistor 1226 in order to quickly "start up" currents 1214, 1216 and 1218. It is noted that currents 1214, 1216 and 1218 can each be coupled to different analog circuitry. However, when voltage detector circuit 102 detects $V_{DD}$ 104 within the high voltage range and start signal 1220 is received by transistor 1222, node 1210 is pulled down part way to ground (or a logical low) by activating a transistor 1224 to quickly start up currents 1214, 1216 and 1218. Therefore, the start up may be tailored such when $V_{DD}$ 104 is in the high voltage range, the strength of the pull down of node 1210 is not as hard (or as strong) as when $V_{DD}$ 104 is in the low voltage range.

Within FIG. 12, it is noted that node 1210 has a large capacitance due to the gates of transistors 1204, 1206 and 1208 which are coupled as current mirror devices. When a current source 1212 outputs a small current, the start up time for mirror currents 1214, 1216 and 1218 to reach their final values can be large. As such, transistors 1222, 1224 and 1226 in combination with voltage detector 102 are utilized to pull down node 1210 part way to ground (or logical low) in order to quickly start mirror currents 1214, 1216 and 1218. It is noted that the W/L of transistor 1224 may be less than the W/L of transistor 1226. As such, voltage detector 102 is able to detect which voltage range $V_{DD}$ 104 is within and initiate the use of transistor 1224 or transistor 1226 to pull down node 1210. Specifically, within the present embodiment, transistor 1224 is utilized to pull down node 1210 when $V_{DD}$ 104 is within the high voltage range. Conversely, transistor 1226 is utilized to pull down node 1210 when $V_{DD}$ 104 is within the low voltage range. In this manner, transistor 1226 can be optimized for low range $V_{DD}$ 104 while transistor 1224 can be optimized for high range $V_{DD}$ 104 thereby enable quick start up without causing excessive current spikes in mirror currents 1214, 1216 and 1218.

It is noted that upon reception of start signal 1220 which can be a pulse, transistor 1222 enables transistor 1224 or transistor 1226 to pull down node 1210 toward ground or a logic "0" (low). With start signal 1220 asserted, when $V_{DD}$ 104 is within the low voltage range (e.g., 2.7–3.6 volts), voltage detector circuit 102 detects this condition and outputs a logic "0" (low) signal that causes transistor 1224 to be turned off and transistor 1226 to be turned on. Specifically, the logic "0" (low) signal is received by an inverter circuit 1228 which converts it into a logic "1" (high) signal. Inverter 1228 outputs the logic "1" (high) signal to the gate of transistor 1226. Since the voltage level of the gate of transistor 1226 is higher than its threshold voltage ($V_T$) combined with its source voltage, transistor 1226 is turned on thereby pulling down node 1210 partially to ground (or a logical low) via transistor 1222. Furthermore, the logic "0" (low) signal output by voltage detector 102 is also received by the gate of transistor 1224. Since the voltage level is lower at the gate of transistor 1224 than its threshold voltage ($V_T$) combined with its source voltage, transistor 1224 is turned off.

Within FIG. 12, with start signal 1220 asserted, when $V_{DD}$ 104 is within the high voltage range (e.g., 4.75–5.25 volts), voltage detector circuit 102 detects this condition and outputs a logic "1" (high) signal that causes transistor 1224 to be turned on and transistor 1226 to be turned off. Specifically, the logic "1" (high) signal is received by the gate of transistor 1224. Since the voltage level of the gate of transistor 1224 is higher than its threshold voltage ($V_T$) combined with its source voltage, transistor 1224 is turned on thereby pulling down node 1210 partially to ground (or a logical low) via transistor 1222. Furthermore, the logic "1" (high) signal output by voltage detector 102 is also received by inverter 1228 which converts it into a logic "0" (low) signal. Inverter 1228 outputs the logic "0" (low) signal to the gate of transistor 1226. Since the voltage level is lower at the gate of transistor 1226 than its threshold voltage ($V_T$) combined with its source voltage, transistor 1226 is turned off.

Within the present embodiment, transistors 1202, 1204, 1206 and 1208 are each implemented as a PMOS while transistors 1222, 1224 and 1226 are each implemented as a NMOS. However, the present embodiment is not limited to such implementation. It is noted that transistors 1202, 1204, 1206, 1208, 1222, 1224 and 1226 can be implemented in different ways in accordance with the present embodiment. For example, transistors 1202, 1204, 1206, 1208, 1222, 1224 and 1226 may each be implemented as, but is not limited to, a PMOS or NMOS device. However, for this change to be implemented, it may involve implementing circuit 1200 in a different manner. It is noted that transistors 1202, 1204, 1206, 1208, 1222, 1224 and 1226 can each be referred to as a switching element. Additionally, transistors 1224 and 1226 can each be referred to as a pull-down element. It is noted that circuit 1200 may be implemented in a wide variety of ways.

Within circuit 1200 of FIG. 12, the source of transistor 1202 is coupled to $V_{DD}$ 104 while its drain and gate are coupled to the input of current source 1212. The output of current source 1212 is coupled to ground or a logic "0" (low). Additionally, the drain and gate of transistor 1202 are coupled to the gate of transistor 1204. The source of transistor 1204 is coupled to $V_{DD}$ 104 while its drain may be coupled to analog circuitry. The gate of transistor 1204 is also coupled to the gate of transistor 1206. The source of transistor 1206 is coupled to $V_{DD}$ 104 while its drain may be coupled to analog circuitry. The gate of transistor 1206 is also coupled to node 1210, the gate of transistor 1208 and the drain of transistor 1222. The source of transistor 1208 is coupled to $V_{DD}$ 104 while its drain may be coupled to analog circuitry. The gate of transistor 1222 is coupled to receive start signal 1220 while its source is coupled to the drains of transistors 1224 and 1226. The source of transistor 1224 is coupled to ground or a logic "0" (low) while its gate is coupled to the output of voltage detector 102 and the input of inverter 1228. The gate of transistor 1226 is coupled to the output of inverter 1228 while its source is coupled to ground or a logic "0" (low). The voltage detector 102 is coupled to $V_{DD}$ 104 and is also coupled to ground or a logic "0" (low).

Within FIG. 12, it is appreciated that voltage detector circuit 102 may be implemented in any manner similar to that described herein. For example, voltage detector 102 may be implemented as, but is not limited to, voltage detector circuit 200, 400, 500, 600 or 700.

Figure 13:
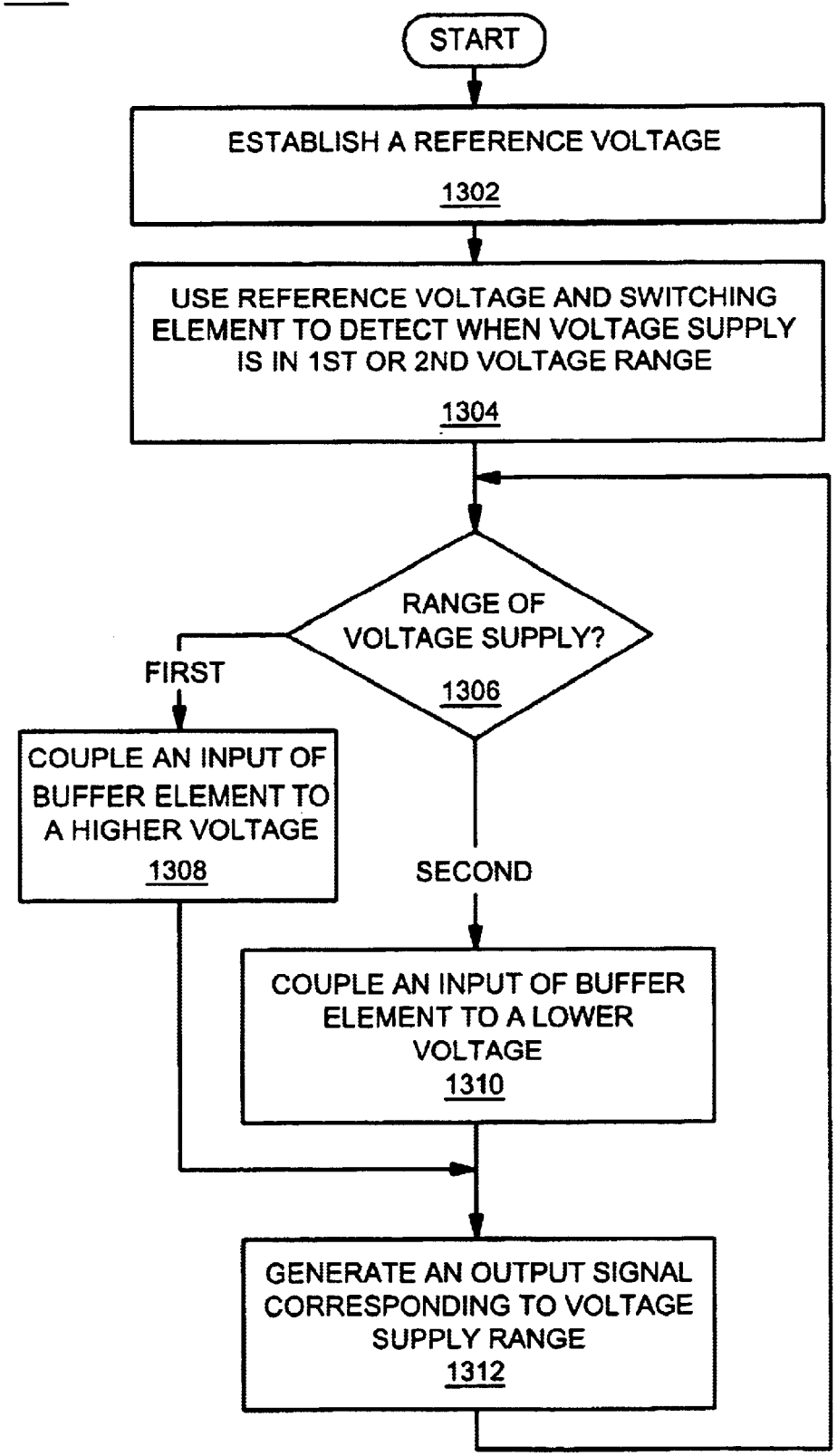
FIG. 13 is a flowchart of operations performed in accordance with an embodiment of the present invention for detecting when a voltage supply is within a first voltage range or a second voltage range.

FIG. 13 is a flowchart 1300 of operations performed in accordance with an embodiment of the present invention for detecting when a voltage supply is within a first voltage range or a second voltage range. Flowchart 1300 includes processes of the present invention which, in some embodiments, are carried out by electrical circuit components. Although specific operations are disclosed in flowchart 1300, such operations are exemplary. That is, the present embodiment is well suited to performing various other operations or variations of the operations recited in FIG. 13. Within the present embodiment, it should be appreciated that the operations of flowchart 1300 may be performed by hardware.

At operation 1302, a reference voltage is established. It is understood that there are a wide variety of ways for establishing the reference voltage at operation 1302. For example, the reference voltage can be established by utilizing a bandgap reference voltage (e.g., 202 or 204). Furthermore, the reference voltage can be established in any manner similar to that described herein. However, the establishing of the reference voltage is not limited to these embodiments.

At operation 1304 of FIG. 13, the reference voltage and a switching element (e.g., transistor 206 or 406) are utilized to detect when a voltage supply (e.g., $V_{DD}$ 104) is within a first voltage range or a second voltage range. It is appreciated that there are diverse ways of utilizing the reference voltage and the switching element to detect when a voltage supply is in the first or second voltage range. For example, a switching element with a threshold voltage can be coupled to the reference voltage and a supply voltage. As such, if the relative relationship of the reference voltage and the supply voltage exceeds the switching element's threshold voltage, the switching element then switches thereby detecting when the voltage supply is in the first or second voltage range. It is noted that operation 1304 may be implemented in any manner similar to that described herein. However, operation 1304 is not limited to these embodiments.

At operation 1306, a determination is made as to which voltage range the voltage supply is within. If it is determined that the voltage supply is within the second voltage range at operation 1306, the process proceeds to operation 1310. However, if it is determined that the voltage supply is within the first voltage range at operation 1306, the process proceeds to operation 1308.

At operation 1308 of FIG. 12, an input of the buffer element is coupled to a higher voltage signal, e.g., $V_{DD}$ or a logic "1" (high). It is understood that the coupling of the input of the buffer element to a higher voltage signal at operation 1308 may be implemented in a wide variety of ways. For example, a transistor (e.g., 206 or 406) may be utilized at operation 1308 to couple the input of the buffer element to a higher voltage signal. It is noted that the coupling of the input of the buffer element to a higher voltage signal at operation 1308 can be done in any manner similar to that described herein.

At operation 1310, the input of the buffer element is coupled to a lower voltage signal, e.g., ground or a logic "0" (low). It is understood that the coupling of the input of the buffer element to a lower voltage signal at operation 1310 may be implemented in a wide variety of ways. For example, a transistor (e.g., 208, 408 or 612) may be utilized at operation 1310 to couple the input of the buffer element to a lower voltage signal. It is noted that the coupling of the input of the buffer element to a lower voltage signal at operation 1310 can be done in any manner similar to that described herein.

At operation 1312 of FIG. 13, an output signal is generated by the buffer element that corresponds to the voltage range that the voltage supply is within. For example, if the voltage supply is within the first voltage range, a first output signal may be generated by the buffer element at operation 1312. Furthermore, if the voltage supply is within the second voltage range, a second output signal may be generated by the buffer element at operation 1312. It is noted that the first and second output signals may be implemented in any manner similar to that described herein. The output signal of operation 1312 can be utilized to change a resistance value of a RC (resistor capacitor) filter circuit. Alternatively, the output signal of operation 1312 can be utilized to change a driver strength of an output driver circuit. Also, the output signal of operation 1312 can be utilized to change a strength of a start up circuit. Upon completion of operation 1312, the process proceeds to the beginning of operation 1306. Alternatively, upon completion of operation 1312, flowchart 1300 can be exited.

The foregoing descriptions of specific embodiments of the present invention have been presented for purposes of illustration and description. They are not intended to be exhaustive or to limit the invention to the precise forms disclosed, and it is evident many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for detecting when a voltage supply is within a first voltage range or a second voltage range, said method comprising:

establishing a reference voltage;

utilizing said reference voltage and a switching element to detect when said voltage supply is in said first voltage range or said second voltage range;

coupling an input of a buffer element to a higher voltage provided said voltage supply is in said first voltage range;

coupling said input of said buffer element to a lower voltage provided said voltage supply is in said second voltage range;

generating an output signal utilizing said buffer element; and utilizing said output signal to change a resistance value of a RC (resistor capacitor) filter circuit.

2. The method as described in claim 1, wherein said switching element is coupled to said reference voltage and said voltage supply.

3. The method as described in claim 1, wherein said buffer element comprises a Schmitt trigger circuit.

4. The method as described in claim 1, wherein said coupling said input of said buffer element to said higher voltage involves a first transistor and said coupling said input of said buffer element to said lower voltage involves a second transistor.

5. The method as described in claim 1, wherein said establishing said reference voltage comprises utilizing a bandgap voltage.

6. The method as described in claim 1, wherein said coupling said input of said buffer element to said higher voltage comprises utilizing a transistor.

7. The method as described in claim 1, wherein said coupling said input of said buffer element to said lower voltage comprises utilizing a transistor.

8. A method for detecting when a voltage supply is within a first voltage range or a second voltage range, said method comprising:

establishing a reference voltage;

utilizing said reference voltage and a switching element to detect when said voltage supply is in said first voltage range or said second voltage range;

coupling an input of a buffer element to a higher voltage provided said voltage supply is in said first voltage range;

coupling said input of said buffer element to a lower voltage provided said voltage supply is in said second voltage range;

generating an output signal utilizing said buffer element; and utilizing said output signal to change a driver strength of an output driver circuit.

9. The method as described in claim 8, wherein said switching element is coupled to said reference voltage and said voltage supply.

10. The method as described in claim 8, wherein said buffer element comprises a Schmitt trigger circuit.

11. The method as described in claim 8, wherein said coupling said input of said buffer element to said higher voltage involves a first transistor and said coupling said input of said buffer element to said lower voltage involves a second transistor.

12. The method as described in claim 8, wherein said establishing said reference voltage comprises utilizing a bandgap voltage.

13. The method as described in claim 8, wherein said coupling said input of said buffer element to said higher voltage comprises utilizing a transistor.

14. The method as described in claim 8, wherein said coupling said input of said buffer element to said lower voltage comprises utilizing a transistor.

15. A method for detecting when a voltage supply is within a first voltage range or a second voltage range, said method comprising:

establishing a reference voltage;

utilizing said reference voltage and a switching element to detect when said voltage supply is in said first voltage range or said second voltage range;

coupling an input of a buffer element to a higher voltage provided said voltage supply is in said first voltage range;

coupling said input of said buffer element to a lower voltage provided said voltage supply is in said second voltage range;

generating an output signal utilizing said buffer element; and utilizing said output signal to change a strength of a start up circuit.

16. The method as described in claim 15, wherein said switching element is coupled to said reference voltage and said voltage supply.

17. The method as described in claim 15, wherein said buffer element comprises a Schmitt trigger circuit.

18. The method as described in claim 15, wherein said coupling said input of said buffer element to said higher voltage involves a first transistor and said coupling said input of said buffer element to said lower voltage involves a second transistor.

19. The method as described in claim 15, wherein said establishing said reference voltage comprises utilizing a bandgap voltage.

20. The method as described in claim 15, wherein said establishing said reference voltage comprises utilizing a current source and a transistor.

* * * * *